US 6,740,931 B2

(12) United States Patent
Kouzuki et al.

(10) Patent No.: US 6,740,931 B2
(45) Date of Patent: May 25, 2004

(54) SEMICONDUCTOR DEVICE

(75) Inventors: Shigeo Kouzuki, Kawasaki (JP);
Hideki Okumura, Yokohama (JP);
Hitoshi Kobayashi, Yokohama (JP);
Satoshi Aida, Kawasaki (JP); Masaru Izumisawa, Kawasaki (JP); Akihiko Osawa, Himeji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/417,110

(22) Filed: Apr. 17, 2003

(65) Prior Publication Data
US 2004/0012038 A1 Jan. 22, 2004

(30) Foreign Application Priority Data
Apr. 17, 2002 (JP) .......................... 2002-115209

(51) Int. Cl.⁷ .............................................. H01L 29/94
(52) U.S. Cl. .................... 257/341; 257/401; 257/329
(58) Field of Search ................... 257/341, 401, 257/329

(56) References Cited
U.S. PATENT DOCUMENTS

| | | | |
|---|---|---|---|
| 4,754,310 A | 6/1988 | Coe | |
| 5,216,275 A | 6/1993 | Chen | |
| 5,438,215 A | 8/1995 | Tihanyi | |
| 5,973,360 A | 10/1999 | Tihanyi | |
| 5,981,996 A | 11/1999 | Fujishima | |
| 6,040,600 A | 3/2000 | Uenishi et al. | |
| 6,060,746 A * | 5/2000 | Bertin et al. | 257/331 |
| 6,081,009 A | 6/2000 | Neilson | |
| 6,184,555 B1 | 2/2001 | Tihanyi et al. | |
| 6,362,505 B1 * | 3/2002 | Tihanyi | 257/329 |
| 6,410,958 B1 * | 6/2002 | Usui et al. | 257/329 |
| 6,521,954 B1 | 2/2003 | Kouzuki et al. | |
| 2002/0070418 A1 | 6/2002 | Kinzer et al. | |

FOREIGN PATENT DOCUMENTS

| | | |
|---|---|---|
| JP | 08-222735 | 8/1996 |
| JP | 2000-504879 | 4/2000 |
| JP | 2001-111041 | 4/2001 |
| JP | 2001-111050 | 4/2001 |
| JP | 2001-168327 | 6/2001 |
| JP | 2001-230412 | 8/2001 |
| JP | 2002-016250 | 1/2002 |
| JP | 2002-164540 | 6/2002 |
| JP | 2002-170955 | 6/2002 |

* cited by examiner

Primary Examiner—David Nelms
Assistant Examiner—Tu-Tu Ho
(74) Attorney, Agent, or Firm—Oblon, Spivak, McClelland, Maier & Neustadt, P.C.

(57) ABSTRACT

A semiconductor device which comprises a semiconductor substrate, semiconductor pillar regions each having first and second semiconductor pillar portions, the second semiconductor pillar portion being sandwiched by the first semiconductor pillar portions, a base layer formed in the second semiconductor pillar portion, a source diffusion layer formed in the base layer, a gate insulating film formed on a portion of the base layer, a gate electrode formed on the gate insulating film, and isolation regions which isolates the semiconductor pillar regions from each other and are formed in trenches between the semiconductor pillar regions, wherein each of the isolation regions comprises an oxide film formed on an inner surface of the trench and a nitride film formed on the oxide film, the nitride film being filled in the trench, and a film thickness ratio of the oxide film and the nitride film is in a range of 2:1 to 5:1.

44 Claims, 15 Drawing Sheets

SEMICONDUCTOR DEVICE

CROSS-REFERENCE TO RELATED APPLICATIONS

This application is based upon and claims the benefit of priority from the prior Japanese Patent Application No. 2002-115209, filed Apr. 17, 2002, the entire contents of which are incorporated herein by reference.

BACKGROUND OF THE INVENTION

1. Field of the Invention

The present invention relates to a semiconductor device, and in particular, to a structure of a trench isolation region in a semiconductor device having a plurality of vertical MISFET cells, and is used for, for example, a power MISFET.

2. Description of the Related Art

In a conventional planar type power MISFET, the current path region and the breakdown voltage holding region are the same region, and there is a trade-off relationship that the ON-resistance increases if the region thickness is increased in order to increase the breakdown voltage, and on the other hand, the breakdown voltage decreases if the region thickness is decreased in order to decrease the ON-resistance, and it has been difficult to satisfy the both.

In contrast with the planar type power MISFET, a power MISFET having a super junction structure has been proposed.

FIG. 28 schematically shows a portion of a cross-sectional structure of an element portion of a 600 V system power MISFET having a conventional super junction structure.

When the super junction structured power MISFET is manufactured, an epitaxial growth Si layer of 5 to 8 $\mu$m is formed on an Si substrate. Thereafter, a patterning and a boron (B) implantation are carried out to the epitaxially grown Si layer to form a p$^+$-type region, and then, a patterning and a phosphorus (P) implantation are carried out to the epitaxially grown Si layer to form an n$^+$-type region. Such a basic process is carried out about 6 times until the element is completed.

In other words, in such a manufacturing method, epitaxial growth is carried out as many as 6 times, and to form the p$^+$type region and the n$^+$-type region, patterning is carried out as many as 12 times and implantation is carried out as many as 12 times until the element is completed. Thus, the manufacturing steps greatly increases, and the manufacturing cost increases. A chip price of the element (Junction structure power MISFET) manufactured in this way becomes near to that of a large area chip of the planar type power MISFET (low ON-resistance type).

Moreover, it is difficult to make the dimension in the lateral direction (the dimension in the channel length direction) of the unit cell of the element to be fine. In fact, in a 600 V system power MISFET, the unit cell width of the element is about 30 $\mu$m.

In consideration of such circumstances, in "Semiconductor device and method of manufacturing the same" of Japanese Patent KOKAI Publication No. 2002-170955 (Application No. 2001-285472), applicants of the present application have disclosed a three-layered pillar (for example, an NPN layer) structure which provides a function substantially the same as that of the super junction structure, and proposed a power MISFET which can cope with both low ON-resistance and high breakdown voltage and a manufacturing method which can manufacture the device without causing a great increase in the number of steps and thus decreases costs.

In the above-described proposal, a trench is formed in the epitaxial semiconductor layer on a semiconductor substrate in order to form the three-layered pillar. Then, a first conductivity type impurity and a second conductivity type impurity whose diffusion coefficient is smaller than the first conductivity type impurity are implanted into the side surface of the trench by an ion-implantation method, to change the epitaxial layer region between the adjacent trenches to the three-layered pillar structure due to the difference in diffusion coefficient.

In accordance with the above-described proposal, the three-layered pillar can be formed by implanting the first conductivity type impurity and the second conductivity type impurity, respectively, in the epitaxial layer only one time. The pn-junction between the p-type layer and the n-type layer in the three-layered pillar are formed so as to be substantially perpendicular to the main surface of the semiconductor substrate.

In the above-described proposal, as trench isolation films between the MISFET cells, an example was shown in which insulating films (an oxide film and a nitride film) cover a polycrystalline silicon layer formed on the semiconductor substrate and the bottom surface and the side surface of the trench provided in the polycrystalline silicon layer, or a polycrystalline silicon layer formed on the semiconductor substrate and the bottom surface, the side surface, and the upper surface of the trench provided in the polycrystalline silicon layer.

Further, a structure in which only an oxide film is filled in the trench between the MISFET cells is disclosed in "Vertical trench MISFET and method of manufacturing the same" of U.S. Pat. No. 5,981,996. However, the details thereof are not disclosed.

BRIEF SUMMARY OF THE INVENTION

According to a first aspect of the present invention, there is provided a semiconductor device comprising a semiconductor substrate of a first conductivity type, which is a common drain of a plurality of MISFET cells; a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions; a base layer of the second conductivity type, which is formed in a surface of the second semiconductor pillar portion of each of the semiconductor pillar regions, the base layer having an impurity concentration which is higher than the second semiconductor pillar portions; a source diffusion layer of the first conductivity type, which is selectively formed in a surface of the base layer; a gate insulating film formed on a portion of the base layer, which is sandwiched by the source diffusion layer and each of the first semiconductor pillar portions; a gate electrode formed on the gate insulating film; and a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate, wherein each of the isolation regions comprises an oxide film formed on an inner surface of the trench and a nitride film formed on the oxide film, the nitride film being filled in the trench, and a film thickness ratio of the oxide film and the nitride film is in a range of 2:1 to 5:1.

According to a second aspect of the present invention, there is provided a semiconductor device comprising a semiconductor substrate of a first conductivity type, which is a common drain of a plurality of MISFET cells; a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions; a base layer of the second conductivity type, which is formed in a surface of the second semiconductor pillar portion of each of the semiconductor pillar regions, the base layer having an impurity concentration which is higher than the second semiconductor pillar portion; a source diffusion layer of the first conductivity type, which is selectively formed in a surface of the base layer; a gate insulating film formed on a portion of the base layer, which is sandwiched by the source diffusion layer and each of the first semiconductor pillar portions; a gate electrode formed on the gate insulating film; and a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate, wherein each of the isolation regions comprises a first oxide film formed on an inner surface of the trench, a nitride film formed on the first oxide film, and a second oxide film formed to cover an upper surface of a cavity provided in the trench by the nitride film.

According to a third aspect of the present invention, there is provided a semiconductor device comprising a semiconductor substrate of a first conductivity type, which is a common drain of a plurality of MISFET cells; a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portion; a base layer of the second conductivity type, which is formed in a surface of the second semiconductor pillar portion of each of the semiconductor pillar regions, the base layer having an impurity concentration which is higher than the second semiconductor pillar portions; a source diffusion layer of the first conductivity type, which is selectively formed in a surface of the base layer; a gate insulating film formed on a portion of the base layer, which is sandwiched by the source diffusion layer and each of the first semiconductor pillar portions; a gate electrode formed on the gate insulating film; and a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate, wherein each of the isolation regions comprises a first oxide film formed on an inner surface of the trench, a nitride film formed on the first oxide film, and a second oxide film formed on the nitride film, the second oxide film being doped with boron and phosphorus and filled in the trench.

According to a fourth aspect of the present invention, there is provided a semiconductor device comprising a semiconductor substrate of a first conductivity type, which is a common drain of a plurality of MISFET cells; a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions; a base layer of the second conductivity type, which is formed in a surface of the second semiconductor pillar portion of each of the semiconductor pillar regions, the base layer having an impurity concentration which is higher than the second semiconductor pillar portion; a source diffusion layer of the first conductivity type, which is selectively formed in a surface of the base layer; a gate insulating film formed on a portion of the base layer, which is sandwiched by the source diffusion layer and each of the first semiconductor pillar portions; a gate electrode formed on the gate insulating film; and a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate, wherein each of the isolation regions comprises a first oxide film formed on an inner surface of the trench, a nitride film formed on the first oxide film, a second oxide film formed on the nitride film and doped with boron and phosphorus, a third oxide film formed to cover an upper surface of a cavity provided in the trench by the second oxide film.

According to a fifth aspect of the present invention, there is provided a semiconductor device comprising a semiconductor substrate of a first conductivity type, which is a common drain of a plurality of MISFET cells; a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions; a base layer of the second conductivity type, which is formed in a surface of the second semiconductor pillar portion of each of the semiconductor pillar regions, the base layer having an impurity concentration which is higher than the second semiconductor pillar portion; a source diffusion layer of the first conductivity type, which is selectively formed in a surface of the base layer; a gate insulating film formed on a portion of the base layer, which is sandwiched by the source diffusion layer and each of the first semiconductor pillar portions; a gate electrode formed on the gate insulating film; and a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate, wherein each of the isolation regions comprises a silicon film formed in the trench.

According to a sixth aspect of the present invention, there is provided a semiconductor device comprising a semiconductor substrate of a first conductivity type, which is a common drain of a plurality of MISFET cells; a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions; a base layer of the second conductivity type, which is formed in a surface of the second semiconductor pillar portion of each of the semiconductor pillar regions, the base layer having an impurity concentration which is higher than the second semiconductor pillar portion; a source diffusion layer of the first conductivity type, which is selectively formed in a surface of the base layer; a gate insulating film formed on a portion of the base layer, which is sandwiched by the source diffusion layer and each of the first semiconductor pillar portions; a gate electrode formed on the gate insulating film; and a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate, wherein each of the isolation regions comprises a porous silica film filled in the trench.

According to a seventh aspect of the present invention, there is provided a semiconductor device comprising a semiconductor substrate of a first conductivity type, which is a common drain of a plurality of MISFET cells; a plurality of semiconductor pillar regions each having first and second semiconductor pillar portions formed on a surface of the semiconductor substrate, the first and second semiconductor pillar portions having a vertically strip-shaped cross-section, the first semiconductor pillar portion having the first conductivity type, the second semiconductor pillar portion having a second conductivity type, the second semiconductor pillar portion being sandwiched by the first semiconductor pillar portions; a base layer of the second conductivity type, which is formed in a surface of the second semiconductor pillar portion of each of the semiconductor pillar regions, the base layer having an impurity concentration which is higher than the second semiconductor pillar portions; a source diffusion layer of the first conductivity type, which is selectively formed in a surface of the base layer; a gate insulating film formed on a portion of the base layer, which is sandwiched by the source diffusion layer and the first semiconductor pillar portion; a gate electrode formed on the gate insulating film; and a plurality of isolation regions which isolates the semiconductor pillar regions from each other, the isolation regions being formed in trenches provided between the semiconductor pillar regions, the trenches being formed on the surface of the semiconductor substrate and reaching the surface of the semiconductor substrate, wherein each of the isolation regions comprises an particle composition oxide film made of oxide particles filled in the trench.

DETAILED DESCRIPTION OF THE INVENTION

Hereinafter, embodiments of the present invention will be described with reference to the accompanying drawings.

FIGS. 1 to 6 are cross sectional views schematically showing cross-sections of a semiconductor device at the stages in a method of manufacturing the semiconductor device. Here, an example of a vertical type power MISFET (DTMIS: Deep Trench MISFET) having a structure which can ensure medium or high breakdown voltage which is greater than or equal to 200 V will be described as a semiconductor device.

Figure 1:
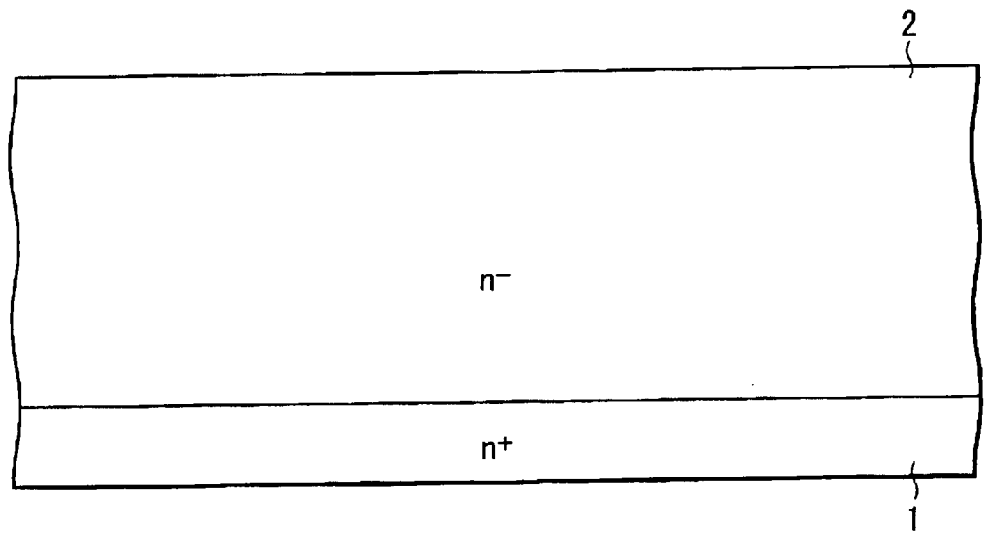
FIG. 1 is a cross sectional view showing a portion of a semiconductor device in a step of manufacturing the semiconductor device.

First, as shown in FIG. 1, an n$^-$-type epitaxial Si layer 2 having a low impurity concentration (high resistance) is grown on the upper surface of an n$^+$-type Si substrate 1. The n$^+$-type Si substrate 1 has a high impurity concentration and constitutes a common drain layer of the power MISFET.

The impurity concentration of the n$^+$-type Si substrate 1 is, for example, greater than or equal to $1 \times 10^{19}$ (atoms/cm$^3$), and the resistivity is, for example, less than or equal to 0.006 ($\Omega \cdot$cm). The thickness of the n$^-$-type epitaxial Si layer 2 is, for example, 50 $\mu$m, and the impurity concentration thereof is $5 \times 10^{13}$ to $3 \times 10^{14}$ (atoms/cm$^3$).

Figure 2A:
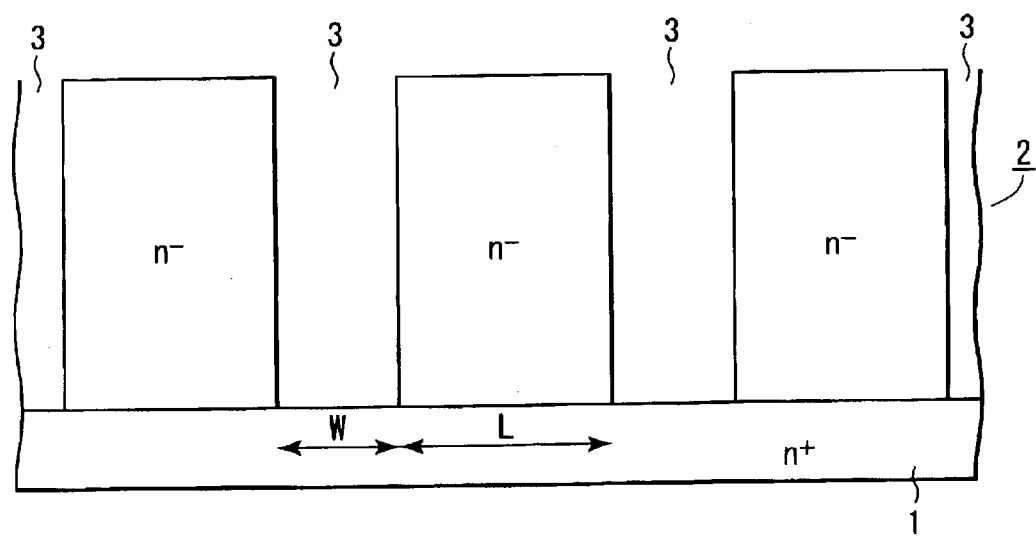
FIG. 2A is a cross sectional view showing the portion of the semiconductor device in a step of manufacturing the semiconductor device, following the step of FIG. 1.

Next, as shown in FIG. 2A, trenches 3, which are deep so as to reach the upper surface of the n$^+$-type Si substrate 1, are formed in the n$^-$-type epitaxial Si layer 2, by using photolithography and RIE (Reactive Ion Etching).

A depth of each of the trenches 3 is, for example, about 51 to 55 $\mu$m, and a width of the trench 3 is, for example, 8 $\mu$m, and an interval between the trenches 3 is, for example, 15 $\mu$m. In order to obtain a breakdown voltage for 600 V series, the depth of the trench 3 is made to be, for example, greater than or equal to 50 $\mu$m. In the figures, the trench 3 is a shape having a uniform width. When RIE is used, the vertical cross-sectional shape of the trench is a tapered shape, however, it is substantially perpendicular to the substrate surface.

Figure 2B:
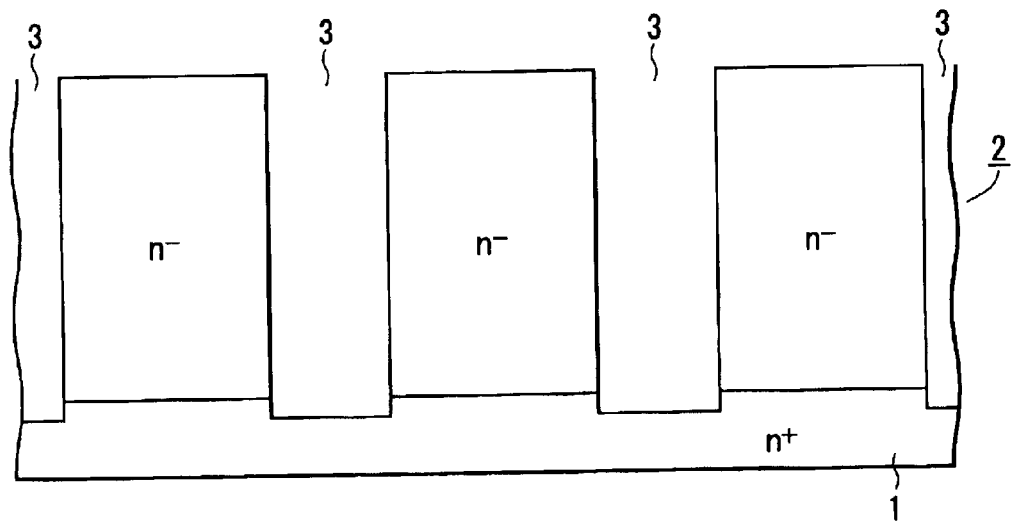
FIG. 2B is a cross sectional view showing the portion of the semiconductor device in a modified example of the step of manufacturing the semiconductor device shown in FIG. 2A.

Moreover, actually, the position of the bottom of the trench 3 is a position which is lower than the upper surface of the n$^+$-type Si substrate 1, as shown in FIG. 2B, since an over-etching is carried out onto the n$^+$-type Si substrate 1 in order to ensure the trench 3 to reach the n$^+$-type Si substrate 1.

Figure 3:
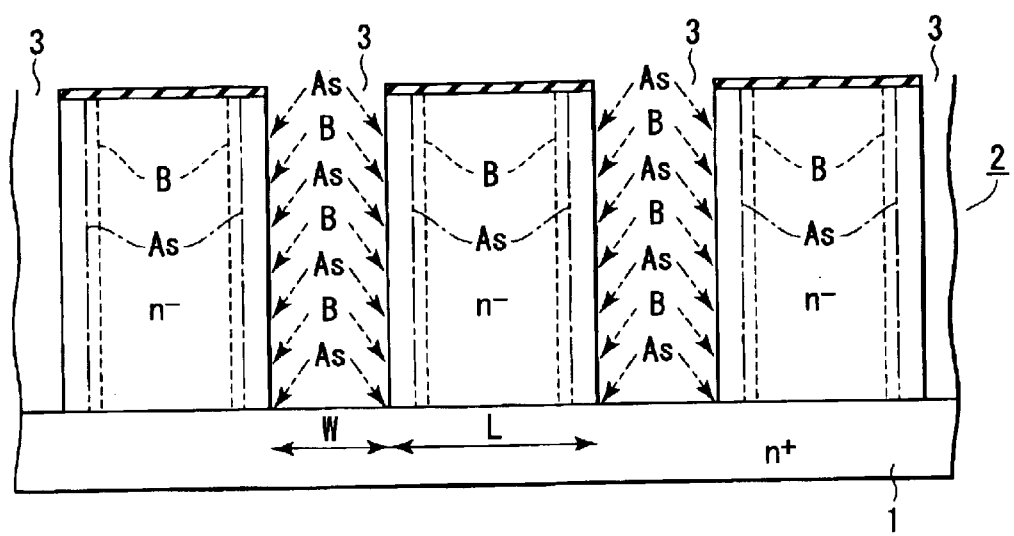
FIG. 3 is a cross sectional view showing the portion of the semiconductor device in a step of manufacturing the semiconductor device, following the step of FIG. 2.

Next, as shown in FIG. 3, arsenic As and boron B are implanted into the side walls of the trenches 3 at implantation angles of from 5° to 7°, by using a rotational ion-implantation method.

Thereafter, an annealing is carried out at 1150° C. for 24 hours to diffuse the implanted As and B at the same time in the mesa structured n$^-$-type epitaxial Si layer 2 portion sandwiched by the trenches 3.

At this time, at 1150° C., the diffusion coefficient of As is about $9 \times 10^{-3}$ $\mu$m$^2$/h, and the diffusion coefficient of B is about $5.5 \times 10^{-2}$ $\mu$m$^2$/h. Since the diffusion coefficient of B is one digit greater than that of As, the As is diffused about 2.5 $\mu$m, and the B is diffused about 7.5 $\mu$m.

Figure 4:
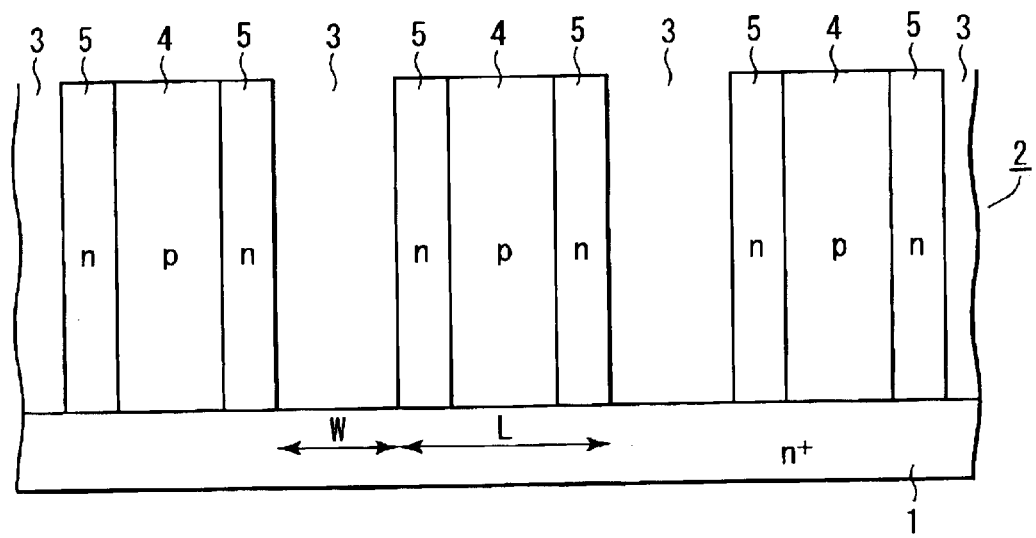
FIG. 4 is a cross sectional view showing the portion of the semiconductor device in a step of manufacturing the semiconductor device, following the step of FIG. 3.

As a result, as shown in FIG. 4, by the above-described annealing, the B diffused from the left side and the B diffused from the right side in FIG. 4 overlap with each other at the center portion of the mesa structured n$^-$-type epitaxial Si layer 2 sandwiched by the trenches 3 to form a p-type pillar region 4 which is a strip shape in cross-section, and at the same time, to form n-type pillar regions 5 sandwiching the p-type pillar region 4 at the left and right outer side portions of the p-type pillar region 4, which are strip shapes in cross-section.

The dimension in the lateral direction of the p-type pillar region 4 formed in this way is about 10 $\mu$m, and the dimension in the lateral direction of the n-type pillar region 5 is about 2.5 $\mu$m. Accordingly, the unit cell width is about 15 $\mu$m, and is about half that of the conventional art. Accordingly, it is possible to make the elements more fine.

The pnp pillar structure, which is formed from the n-type pillar region 5/the p-type pillar region 4/the n-type pillar region 5 which are arranged in the lateral direction, substantially functions in the same way as the conventional super junction structure. Accordingly, it is possible to achieve both low ON-resistance and high breakdown voltage only by ion-implantation of As and B into the side surfaces of the trenches.

Here, when it is supposed that the total amount of B in the p-type pillar region 4 is NB and the total amount of As in the two n-type pillar regions 5 sandwiching the both sides of the p-type pillar region 4 is NAs, it is preferable to set the amounts such that $100 \times |NB-NAs|/NAs \leq 5$. Concretely, the impurity concentration in the p-type pillar region 4 is preferably set to be within $3 \times 10^{15}$ to $18 \times 10^{15}$ (atoms/cm$^3$), and the impurity concentration in the n-type pillar region 5 is preferably set to be within $0.2 \times 10^{15}$ to $8 \times 10^{15}$ (atoms/cm$^3$).

Such a highly accurate impurity amount control can be achieved merely by ion-implanting of As and B into the side surfaces of the trenches. Thus, variation of the impurity concentrations in the p-type pillar region 4 and the n-type pillar region 5 can be sufficiently suppressed, and as a result, an increase in the variation of the characteristic of the elements can be effectively suppressed.

Note that, in FIG. 4, the pn-junction of the n-type pillar region 5 and the p-type pillar region 4 is perpendicular to the upper surface of the n+-type Si substrate 1. Since, in fact, the trench 3 is formed by RIE processing, the pn-junction is tapered from the perpendicular by an inclination corresponding to the inclination of the side wall of the trench 3, however, the pn-junction is substantially perpendicular to the surface of the semiconductor substrate.

Figure 5:
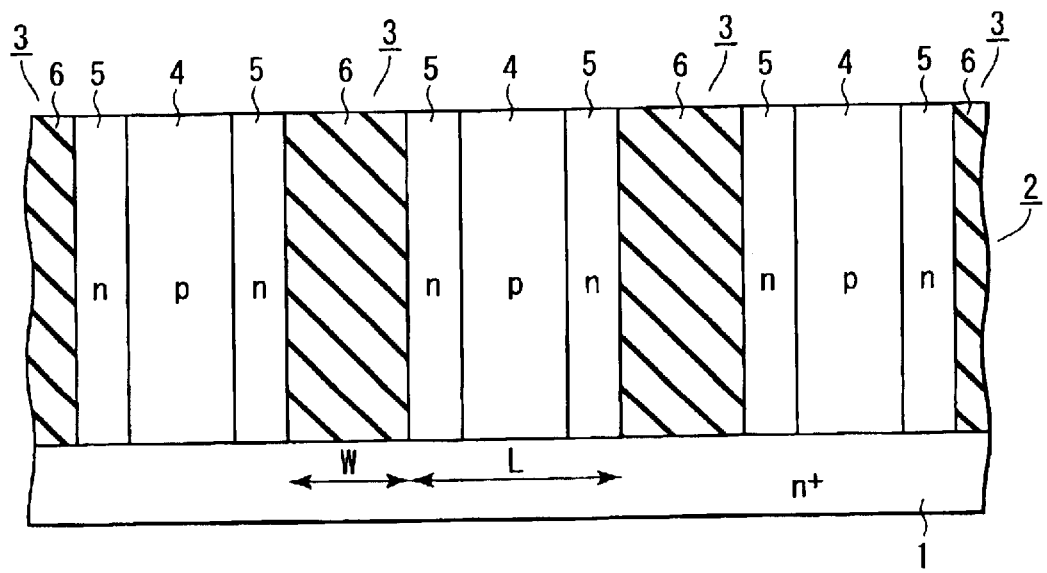
FIG. 5 is a cross sectional view showing the portion of the semiconductor device in a step of manufacturing the semiconductor device, following the step of FIG. 4.

Next, as shown in FIG. 5, the deep trench isolation region having a trench structure is formed by forming an insulator 6 in the trench 3, and the surface of the semiconductor structure is flattened by using CMP (Chemical Mechanical Etching), etching, or the like. As a result, a cell in which the npn pillar is surrounded by trench isolation structures is formed. Note that, as shown in FIG. 2B, when the position of the bottom of the trench 3 is at a position lower than the surface of the n+-type Si substrate 1 due to an over-etching onto the n+-type Si substrate 1, the bottom surface of the insulator 6 is accordingly at the lower position. Namely, the insulator 6 is at a position lower than the surface of the n+-type Si substrate 1.

The details of the structure of the above-described trench isolation region and the step of forming the same will be described later with regard to embodiments.

Figure 6:
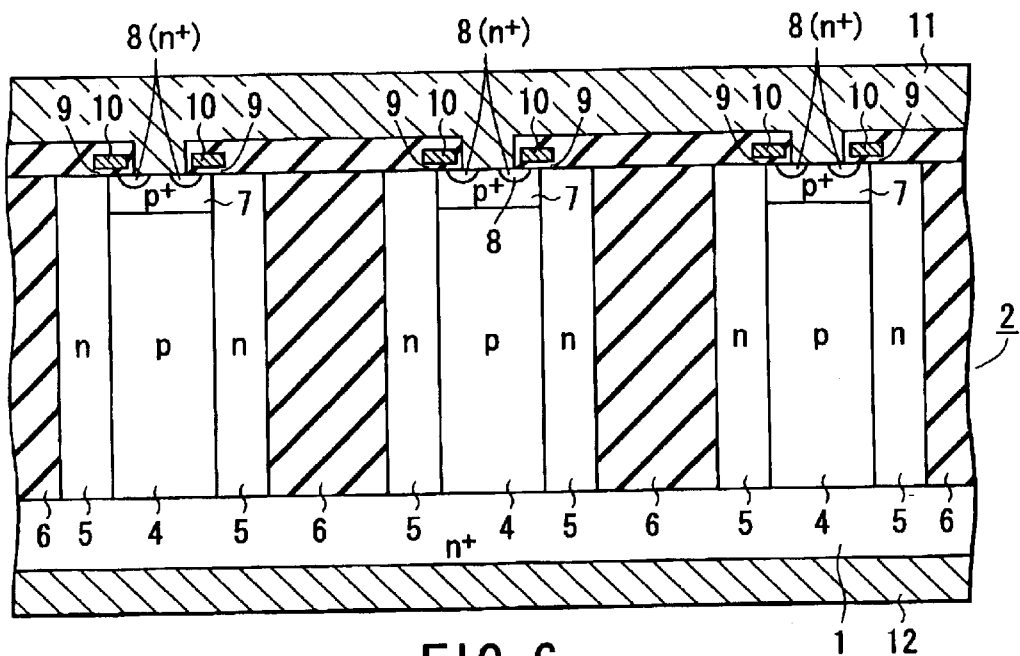
FIG. 6 is a cross sectional view showing the portion of the semiconductor device in a step of manufacturing the semiconductor device, following the step of FIG. 5.

Next, as shown in FIG. 6, a p+-type base layer 7 having a high impurity concentration is formed at the upper surface region of the p-type pillar region 4. The p+-type base layer 7 has an impurity concentration higher than that of the p-type pillar region 4. Next, n+-type source diffusion layers 8 having a high impurity concentration are selectively formed at the upper surface region of the p+-type base layer 7.

A gate insulating film 9 is formed on the p+-type base layer 7 portion sandwiched by the n+-type source diffusion layer 8 and the n-type pillar region 5. A gate electrode 10 is formed on the gate insulating film 9 formed on the p+-type base layer 7 portion sandwiched by the n+-type source diffusion layer 8 and the n-type pillar region 5. As the gate electrode 10, for example, a polysilicon gate, a metal silicide gate (for example, a polycide gate), or a metal gate is used.

Moreover, interlayer insulating film is formed over the upper surface of the semiconductor structure thus formed, then a contact hole is formed at the layer insulating film, and a source electrode 11 is formed. Next, a drain electrode 12 is formed over the lower surface of the n+-type Si substrate 1.

The power MISFET manufactured by the steps shown in FIGS. 1 to 6 can be formed by adding some steps to the process of manufacturing the conventional planar type power MISFET. Concretely, the steps include a step of forming a deep trench 3, a step of ion-implanting As and B, a step of activating the ion-implanted As and B by annealing, and a step of forming the element isolating structure. Namely, the power MISFET manufactured by the steps shown in FIGS. 1 to 6 can obtain an NPN pillar layer, which functions substantially the same as the super junction structure, by a manufacturing method in which the number of the steps is extremely small. Therefore, a large reduction of the manufacturing costs can be realized.

Figure 7:
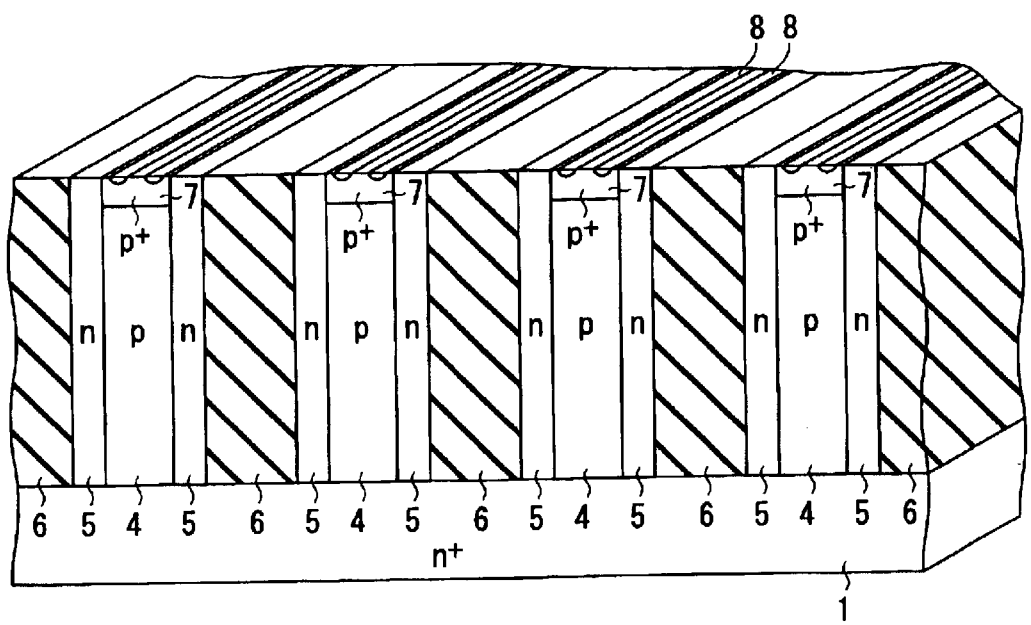
FIG. 7 is a cross sectional and perspective view showing an example of a semiconductor device at a stage when a source electrode is formed in the semiconductor device shown in FIGS. 1 to 6.

FIG. 7 is a cross sectional and perspective view showing an example of a semiconductor device at a stage when an source electrode 11 is formed in the semiconductor device shown in FIGS. 1 to 6. Note that portions which correspond to those in FIG. 6 are denoted by the same reference numerals, and detailed description thereof will be omitted.

In this example, the pattern, in plan view, of the npn pillar structure is stripes.

Figure 8:
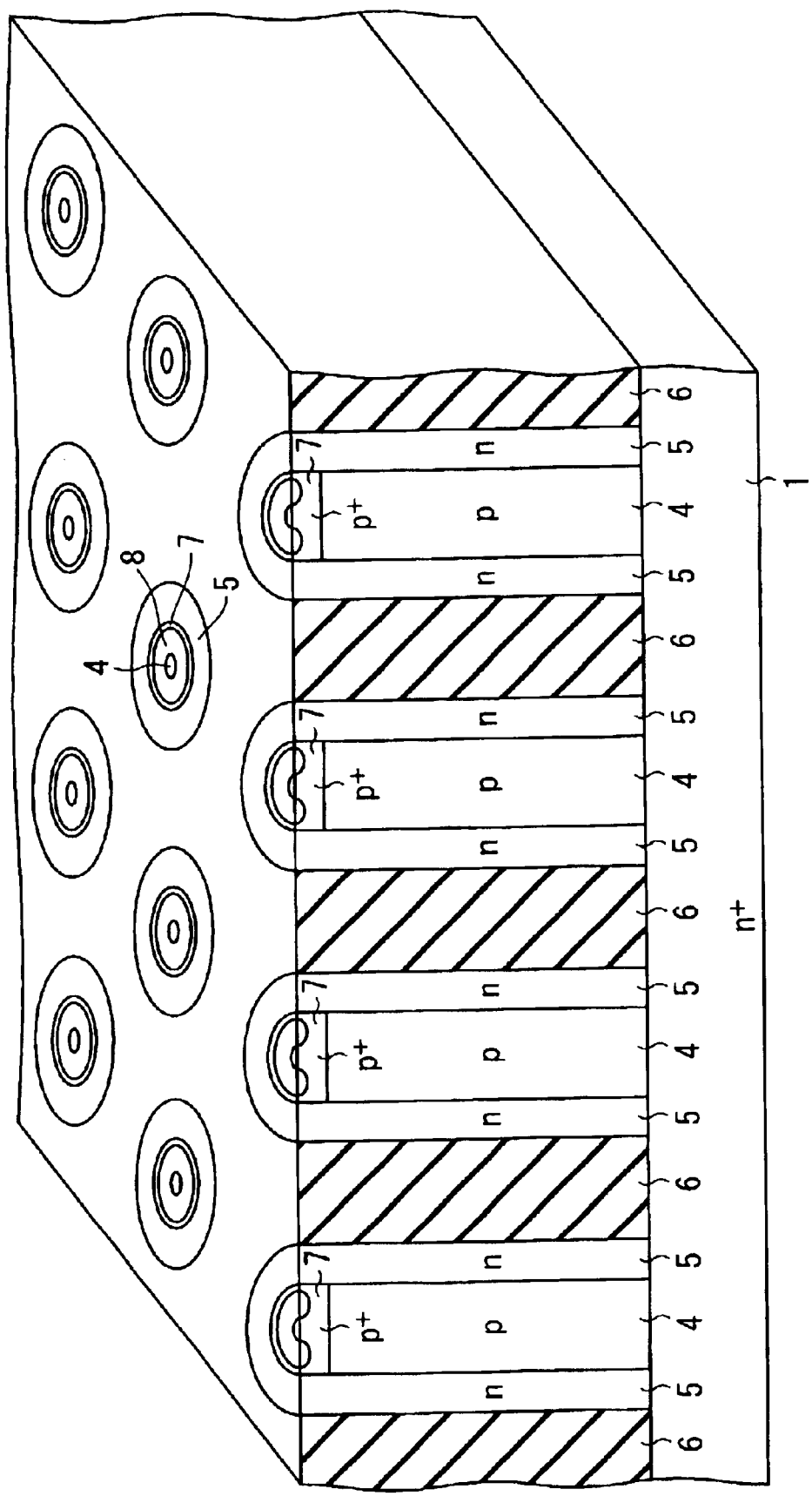
FIG. 8 is a cross sectional and perspective view showing another example of a semiconductor device at a stage when a source electrode is formed in the semiconductor device shown in FIGS. 1 to 6.

FIG. 8 is a cross sectional and perspective view showing another example of a semiconductor device at a stage when an source electrode 11 is formed in the semiconductor device shown in FIGS. 1 to 6. Note that portions which correspond to those in FIG. 6 are denoted by the same reference numerals, and detailed description thereof will be omitted.

The structure shown in FIG. 8 differs from the structure shown in FIG. 7 in that the pattern, in plan view, of the npn pillar structure is a so-called offset mesh shape. In accordance with such a structure, the channel density can be increased, depending on the dimensions of the element.

Further, the pattern, in plan view, of the npn pillar structure may be a so-called mesh shape (in FIG. 8, a shape in which the above and below two npn pillar structures are not offset in the lateral direction).

Figure 9:
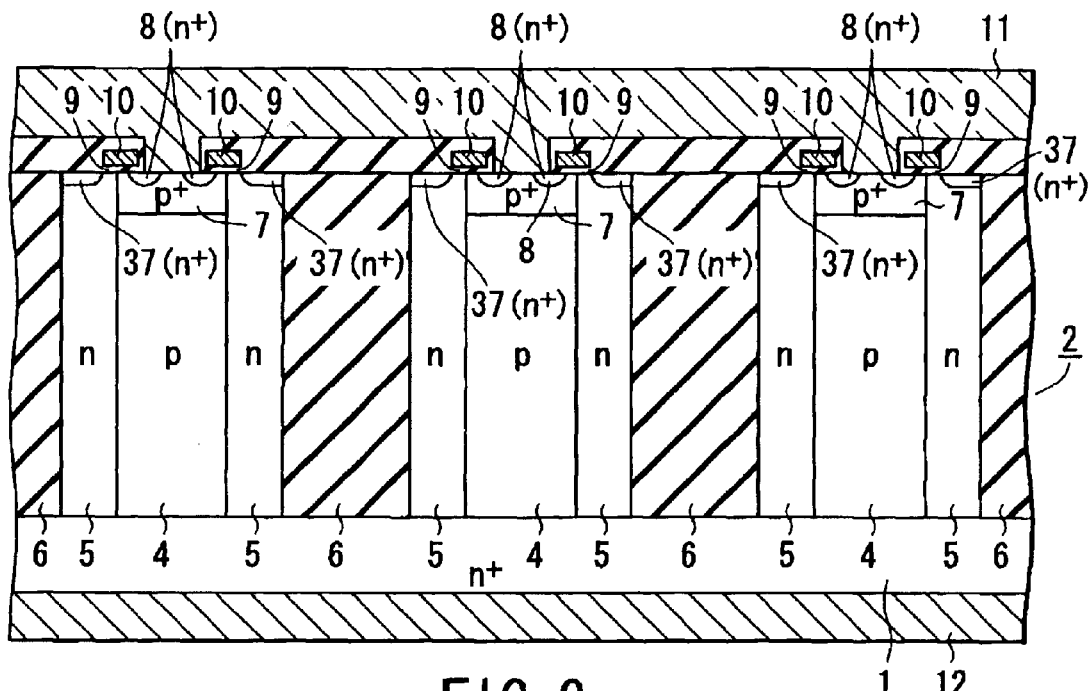
FIG. 9 is a cross sectional view showing a modified example of the semiconductor device shown in FIG. 6.

FIG. 9 is a sectional view showing a modified example of the element structure in the step shown in FIG. 6. Note that portions which correspond to those in FIG. 6 are denoted by the same reference numerals, and detailed description thereof will be omitted.

The structure shown in FIG. 9 differs from the structure shown in FIG. 7 in that an n+-type diffusion layer 37 having a high impurity concentration is formed on the upper surface region of the n-type pillar region 5.

In the case of the structure as shown in FIG. 7, in which no n+-type diffusion layer 37 is provided, a depletion layer extends on the surface region of the n-type pillar region 5 when a voltage is applied between the source and the drain. If electric charges such as Na ions is entered to the surface region of the n-type pillar region 5, depletion is partially prevented, and electric fields concentrate at the portion where the depletion has been prevented, and there is the possibility that a breakdown will arise.

On the other hand, if the n+-type diffusion layer 37 is formed on the surface of the n-type pillar region 5 as shown in FIG. 9, extension of the depletion layer on the surface region of the n-type pillar region 5 can be prevented. Therefore, concentration of electric fields does not arise, and occurrence of a breakdown can be avoided. Further, since the n+-type diffusion layer 37 can be formed at the same time in the step of forming the n+ source diffusion layer 8 by ion-implantation and annealing, there is no need to increase the number of steps. In addition, since the n+-type diffusion layer 37 is formed at the same time by the same ion-implanting step and the same annealing step, the impurity concentration of the n+-type diffusion layer 37 and the impurity concentration of n+source diffusion layer 8 are substantially the same.

<Power MISFET and Method of Manufacturing the Same According to a First Embodiment>

Figure 10:
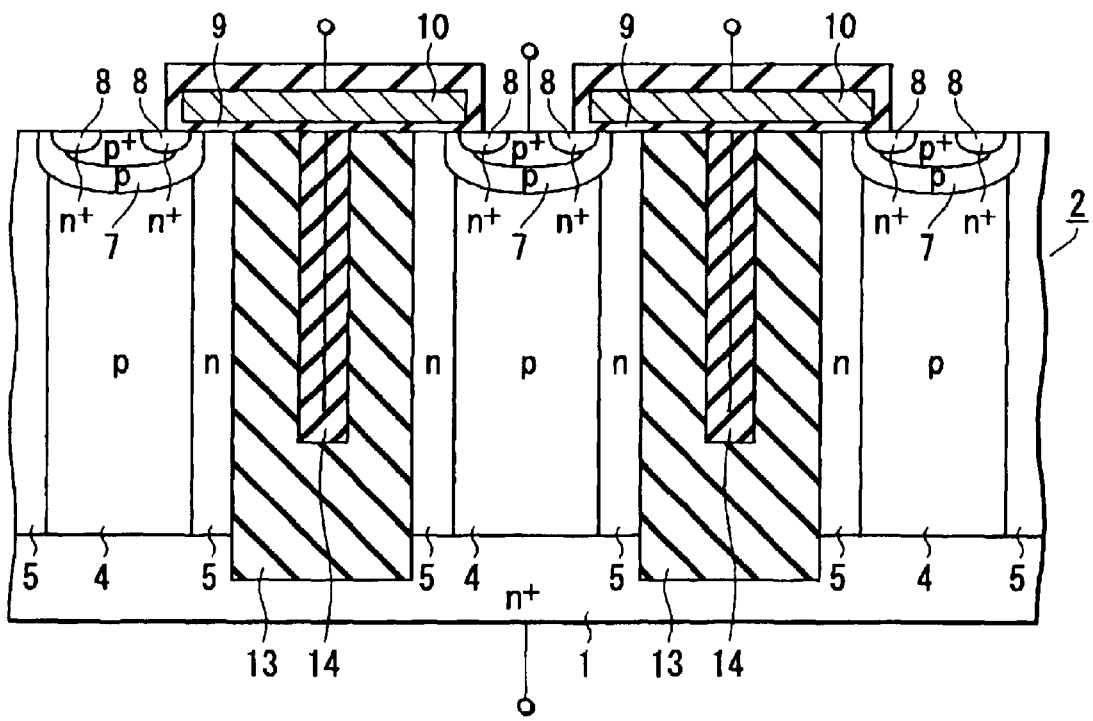
FIG. 10 is a cross sectional view showing a portion of a power MISFET (three unit cells) according to a first embodiment of the present invention.

FIG. 10 is a cross sectional view showing a portion (three unit cells) of a power MISFET manufactured by the method including the steps shown in FIGS. 1 to 6.

Trenches, which are deep so as to reach an n+-type semiconductor substrate 1 (silicon substrate) from the upper surface of an n−-type epitaxial layer (silicon layer) formed by the epitaxial method, are formed on the n+-type semiconductor substrate 1.

N-type and p-type impurities are implanted into the side walls of the trench at angles of about 2 to 7°, and a three-layered pillar region (n-type pillar region 5/p-type pillar region 4/n-type pillar region 5) having a strip-shaped cross-section is formed by the difference in diffusion coefficients of these impurities. The trench is filled with an insulator and constitutes an element isolation region.

A double diffusion-type MISFET is formed by forming the p-type base region 7 on the upper surface region of the p-type pillar region 4 in the three-layered pillar layer, by selectively forming the n⁺-type source region 8 in the p-type base region 7, by forming the gate insulating film (SiO₂ film) 9 on the p-type base region portion sandwiched by the n⁺-type source region 8 and the n-type pillar region 5, and by forming the electrodes (polysilicon, metal silicide, or metal) 10 on the gate insulating film (SiO₂ film) 9 formed on the p-type base region portion sandwiched by the n⁺-type source region 8 and the n-type pillar region 5.

The gate insulating film 9 and gate electrode 10 are formed so as to be over the trench isolation region so as to extend between the n-type pillar regions 5 of adjacent three-layered pillar regions, which n-type pillar regions 5 are at the trench isolation region side.

In filling the trench region with an insulator, first, a thermal oxide film (SiO₂ film) 13 is formed on the inner surfaces (bottom surface and the side surface) of the trench by thermal oxidation. Thereafter, in order to reduce the stress of the SiO₂ film 13, a nitride film (an SiN film) 14 is deposited by CVD (Chemical Vapor Deposition) over the upper surface of the semiconductor structure to fill the trench with the nitride film (SiN film) 14. Then, the deposited nitride film 14 is flattened until the upper surface of the semiconductor structure is exposed by using CMP, to remove the nitride film 14 portion at the outside of the trench.

When the width of the trench is, for example, 8 μm and the depth is, for example, 25 μm, if the film thickness of the SiO₂ film 13 on the inner wall of the trench is 1.0 μm and the film thickness of the SiN film 14 is 0.3 μm (the ratio of the SiO₂ film thickness and the SiN film thickness is 1.0:0.3), the stress of the silicon substrate is suppressed to a minimum. In this way, by suppressing the stress applied to the silicon substrate, the MISFET forming step of the latter step can be easily carried out.

Figure 11:
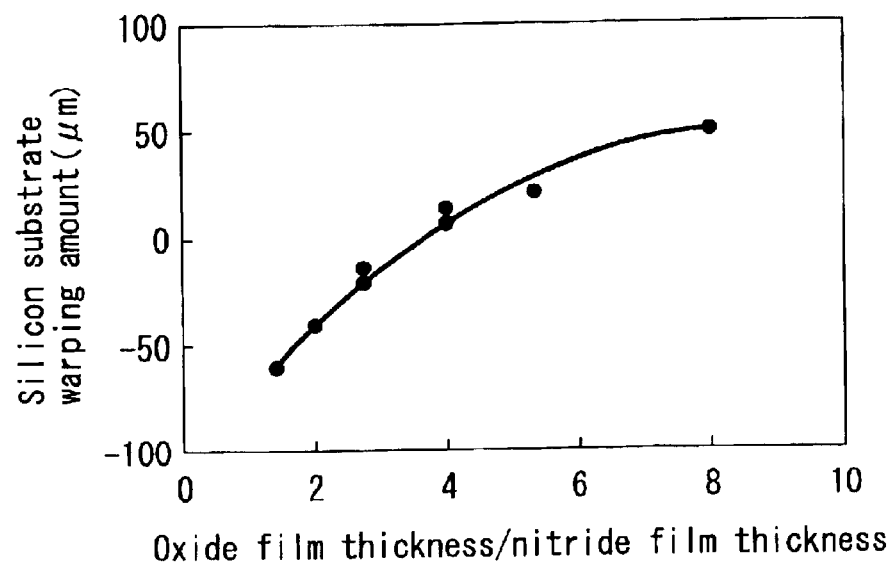
FIG. 11 is a characteristic curve showing an example of an amount of bend of a silicon substrate with respect to a film thickness ratio of an $SiO_2$ film and an SiN film which are insulation materials in the trench of the semiconductor device shown in FIG. 10.

FIG. 11 is a characteristic curve showing an example of the amount of the bend of the silicon substrate with respect to the film thickness ratio of the SiO₂ film 13 and the SiN film 14 which are the insulators in the trench region in FIG. 10.

In this characteristic curve, it is understood that, when the thickness of the n⁺-type Si substrate 1 and the thickness of the n⁻-type epitaxial Si layer 2 are, for example 50 μm or more, if the film thickness ratio of the SiO₂ film 13 and the SiN film 14 is formed so as to be within 2:1 to 5:1, the amount of bend of the silicon substrate can be suppressed to be within +25 to −40 μm.

In other words, according to the power MISFET in FIG. 10, when the trench is filled with the thermal oxide film 13 and the nitride film 14, the stress applied to the silicon substrate can be offset by the compressive stress of the thermal oxide film 13 and the tensile stress of the nitride film 14. At this time, if the film thickness ratio of the thermal oxide film 13 and the nitride film 14 is within 2:1 to 5:1, the stress can be suppressed to be less than or equal to a predetermined value. Moreover, due to the nitride film 14 existing, electrons are trapped at the interface of the thermal oxide film 13 and the nitride film 14 when voltage is applied across the drain and the source, the electric potential applied to the side wall surfaces of the trench is fixed, and the drift phenomenon of the reverse direction breakdown voltage between the drain and the source can be suppressed.

<Power MISFET and Method of Manufacturing the Same According to a Second Embodiment>

Figure 12:
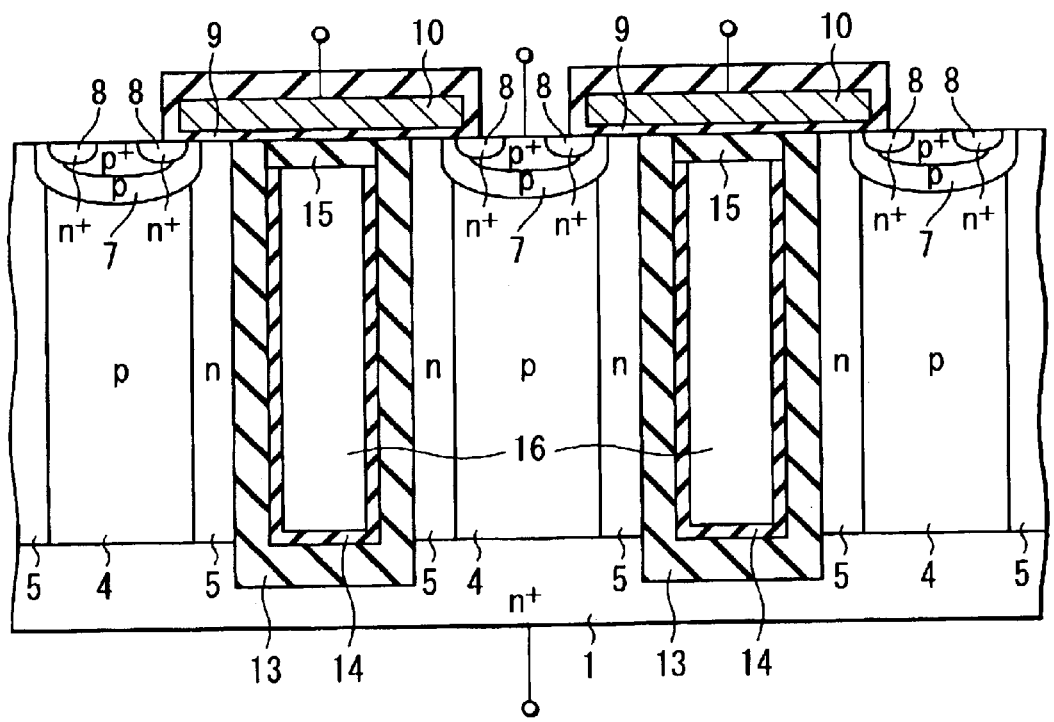
FIG. 12 is a cross sectional view showing a portion of a power MISFET according to a second embodiment of the present invention.

FIG. 12 is a cross sectional view showing a portion of a power MISFET according to a second embodiment of the present invention.

In the power MISFET of FIG. 12, since the structure of the trench isolation region is different from and the other portions are the same as those of the power MISFET of the first embodiment of FIG. 10, portions which are the same as those in FIG. 10 are denoted by the same reference numerals, and description thereof will be omitted.

At the trench isolation region in FIG. 12, the deep trenches are not fully filled with insulators. Rather, a first oxide film 13 such as SiO₂ is formed on the inner surfaces (bottom surface and side surface) of the trench by a deposition method or thermal oxidation, the nitride film 14 is formed so as to be thin on the first oxide film 13 in a state in which a cavity is provided in the trench by the nitride film 14, and a second oxide film (capping insulation film) 15 is formed so as to cover the upper surface of the cavity.

In the semiconductor device of FIG. 12, when an isolation region is formed in the trench, the oxide film 13 and the nitride film 14 are formed so as to be thin while maintaining a predetermined film thickness ratio in the same way as in the first embodiment such that a cavity opening at the surface of the epitaxial Si layer 2 is provided in the trench. Next, the insulating film portion at the outside of the trench is removed by CMP or etching.

By the way, if the cavity which reaches the upper surface of the epitaxial Si layer 2 remains opened, contaminants easily enter into the trench, and this becomes a problem from the standpoint of reliability. Therefore, in order not to expose the cavity onto the silicon substrate surface, a buried layer for covering the surface of the cavity is formed. A second oxide film 15 is formed as the buried layer so as to be over the region of the trench up to a position which is deeper than or equal to 1 μm from the surface of the silicon layer 2. Namely, the surface of the cavity is covered by a capping oxide film such that a sealed cavity 16 exists downward from the position which is deeper than or equal to 1 μm from the surface of the silicon layer 2.

Figure 13:
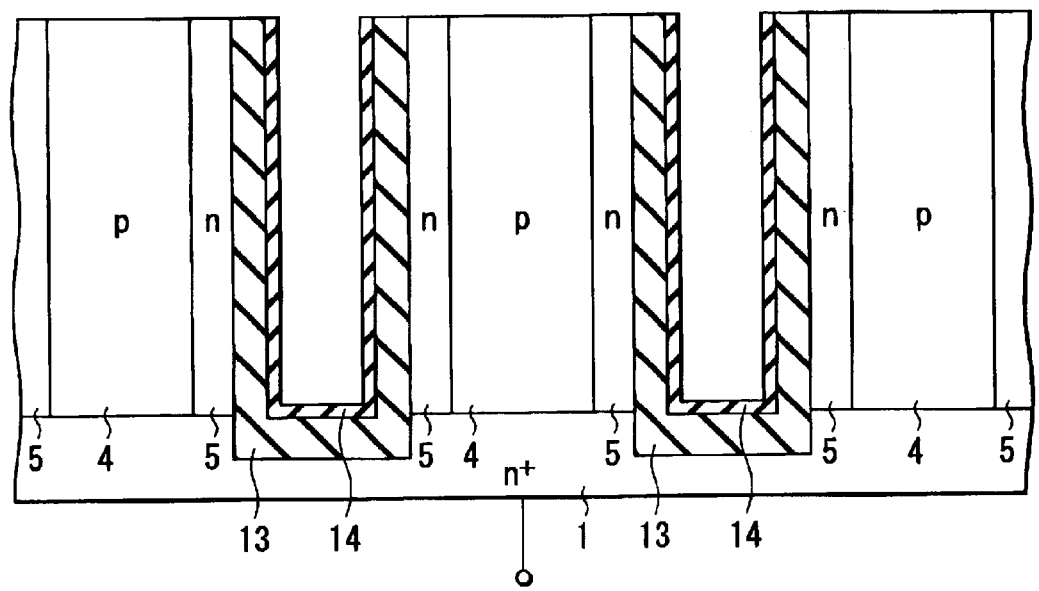
FIG. 13 is a cross sectional view showing a portion of the power MISFET in a step of forming a capping oxide film in the power MISFET according to the second embodiment of the present invention.
Figure 14:
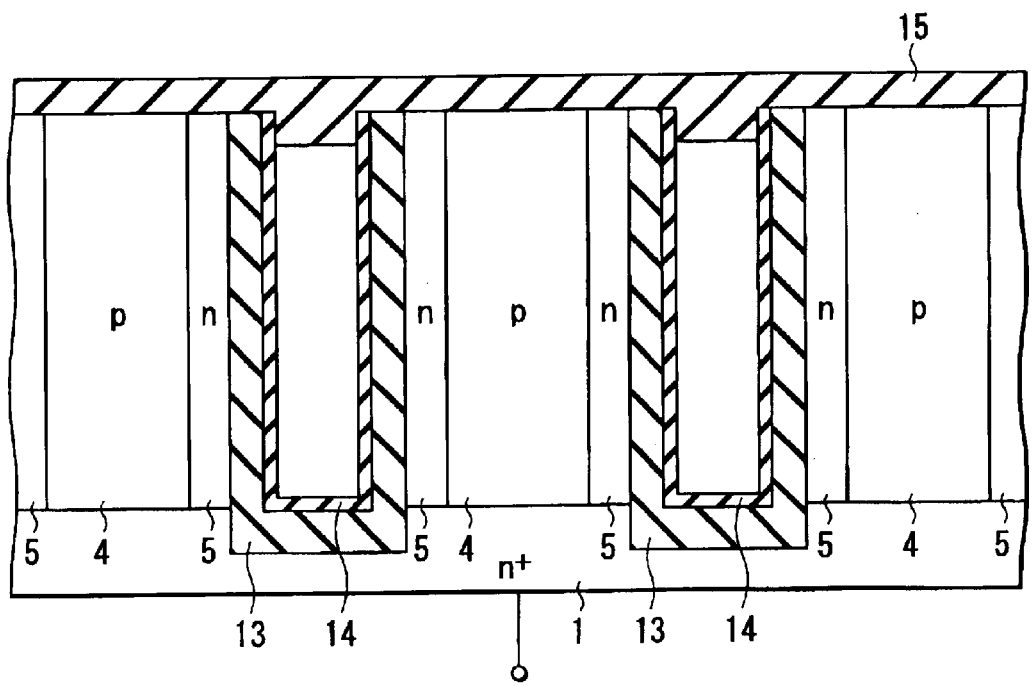
FIG. 14 is a cross sectional view showing the portion of the power MISFET in a step of forming the capping oxide film in the power MISFET, following the step of FIG. 13.
Figure 15:
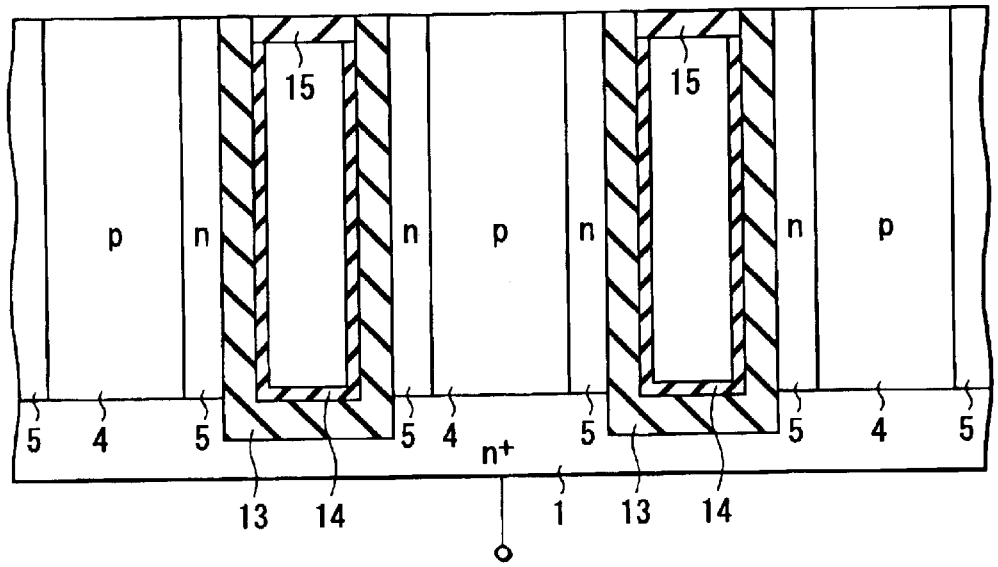
FIG. 15 is a cross sectional view showing the portion of the power MISFET in a step of forming the capping oxide film in the power MISFET, following the step of FIG. 14.

The capping oxide film is formed in a following manner. As shown in FIG. 13, the oxide film 13 and the nitride film 14 are formed over the surface of the semiconductor substrate structure, and then the films 13 and 14 at the outside of the trench are removed by CMP or etching to remain the films 13 and 14 on the inner surface of the trench. Subsequently, an oxide film 15 is deposited over the surface of the semiconductor substrate structure by CVD method, as shown in FIG. 14. At this time, the oxide film 15 is deposited on the upper surface of the cavity to cover the upper surface of the cavity. After that, the oxide film 15 deposited over the outside of trench is removed by CMP or etching to remain only the oxide film 15 on the upper surface of the cavity, as shown in FIG. 15. The oxide film 15 remained on the upper surface of the cavity surface constitutes the capping oxide film 15.

The film thickness of the second oxide film 15 which is greater than or equal to 1 μm can sufficiently withstand the heat treatment applied in the latter step in which the double diffusion-type MISFET is formed, namely, can sufficiently withstand the oxidation treatment for field-oxidizing from the surface of the Si layer 2 to a position whose depth is about 0.5 μm.

Note that, when the above-described process is carried out under the usual process conditions, there is an atmosphere state in the cavity 16. However, when the above-described process is carried out in, for example, vacuum, there is a vacuum state in the cavity 16.

In accordance with the power MISFET of FIG. 12, basically, an advantage (the stress applied to the silicon substrate is suppressed) which is the same as that of the power MISFET in FIG. 10 can be obtained. In addition, as compared with the power MISFET of FIG. 10, the process can be simplified since the cavity is provided in the trench.

<Power MISFET and Method of Manufacturing the Same According to a Third Embodiment>

Figure 16:
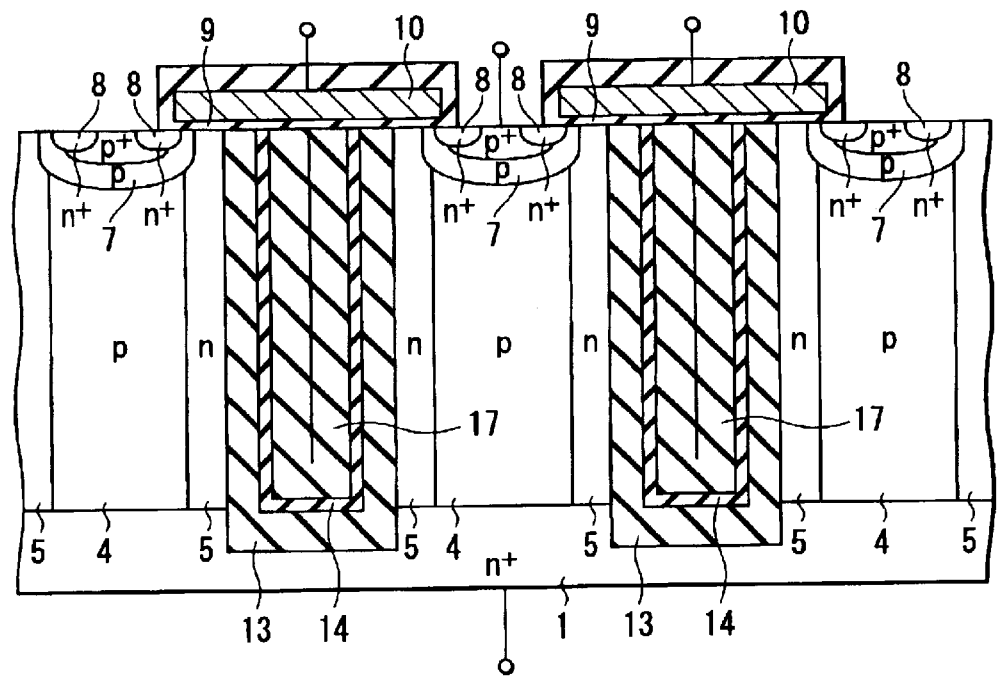
FIG. 16 is a cross sectional view showing a portion of a power MISFET according to a third embodiment of the present invention.

FIG. 16 is a cross sectional view showing a portion of a power MISFET according to a third embodiment of the present invention.

In the power MISFET of FIG. 16, since the structure of the trench isolation region is different from and the other portions are the same as those of the power MISFETs of the first embodiment of FIG. 10 and the second embodiment of FIG. 12, portions which are the same as those in FIGS. 10 and 12 are denoted by the same reference numerals, and description thereof is omitted.

The trench isolation region in FIG. 16 has the feature that the trench isolation region comprises the thermal oxide film 13 formed on the inner surfaces of the trench, the nitride film 14 formed on the thermal oxide film in a state in which a cavity is provided in the trench, and an oxide film (BPSG film) 17 which is formed as a filling in the trench surrounded by the nitride film 14 and in which boron and phosphorus are doped.

When an isolation region is formed in the trench in FIG. 16, the oxide film 13 and the nitride film 14 are formed so as to be thin while maintaining a predetermined film thickness ratio in the same way as in the first embodiment such that a cavity opening at the surface of the epitaxial Si layer 2 is provided in the trench. Thereafter, the BPSG film 17 is deposited over the upper surface of the semiconductor substrate by a CVD method, and next, the insulating film portion formed at the outside of the trench is removed by CMP or etching.

In accordance with the power MISFET of FIG. 16, basically, since the BPSG film 17 is buried in a state in which the advantage which is the same as that of the power MISFET in FIG. 10 is maintained (the stress applied to the silicon substrate is suppressed), as compared with the power MISFET of FIG. 12, the strength of the silicon substrate is maintained stronger.

Since the BPSG film 17 can be easily made to be a thick film, it is easy to bury the BPSG film 17 into the trench. Further, even if impurities exude from the BPSG film 17 by the heat treatment step after the step of burying the BPSG film 17, the nitride film 14 prevents the impurities from being entered.

<Power MISFET and Method of Manufacturing the Same According to a Fourth Embodiment>

Figure 17:
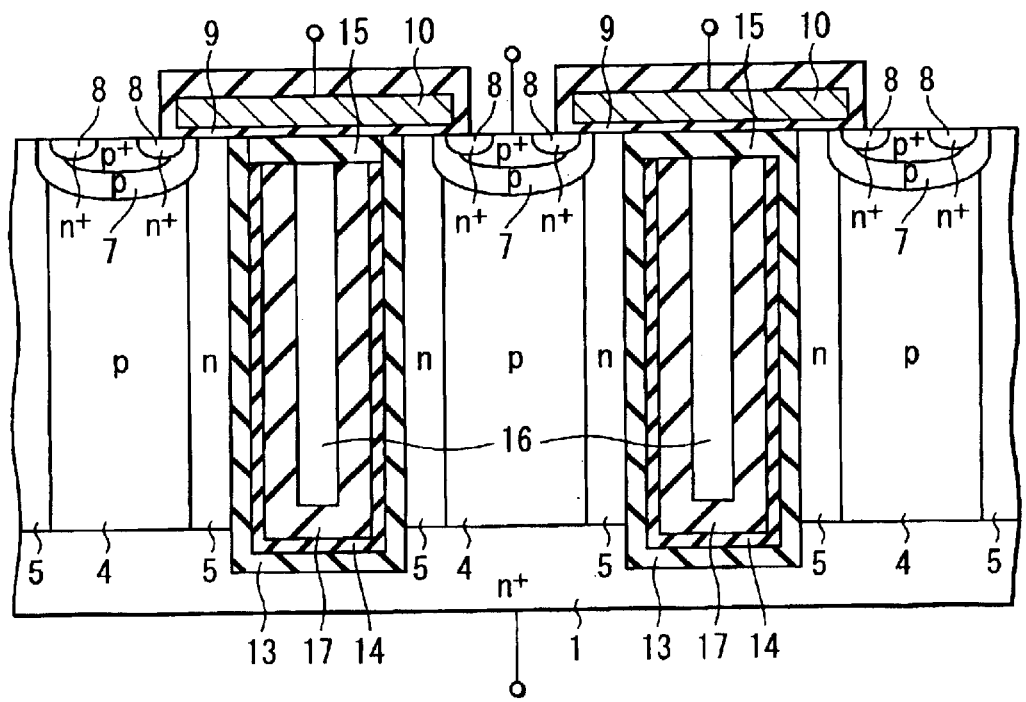
FIG. 17 is a cross sectional view showing a portion of a power MISFET according to a fourth embodiment of the present invention.

FIG. 17 is a cross sectional view showing a portion of a power MISFET according to a fourth embodiment of the present invention.

In the power MISFET of FIG. 17, since a structure of the trench isolation region is different from and other portions are the same as compared with the power MISFETs of the first embodiment of FIG. 10, the second embodiment of FIG. 12, and the third embodiment of FIG. 16, portions which are the same as those in FIGS. 10, 12, 16 are denoted by the same reference numerals, and description thereof will be omitted.

The trench isolation region in FIG. 17 has the feature that the trench isolation region comprises the thermal oxide film 13 formed on the inner surfaces of the trench, the nitride film 14 formed on the thermal oxide film, the BPSG film 17 formed on the nitride film in a state in which the cavity 16 is provided in the trench, and the oxide film 15 formed so as to cover the upper surface of the cavity 16. The oxide film 15 is formed so as to be over the region up to a position of the trench which is deeper than or equal to 1 $\mu$m from the surface of the Si layer 2.

When a trench isolation region in FIG. 17 is formed, the oxide film 13 and the nitride film 14 are formed so as to be thin while maintaining the film thickness ratio of the oxide film 13 and the nitride film 14 to a predetermined value in the same way as in the first embodiment, to provide a cavity opening at the surface of the Si layer 2. Thereafter, the BPSG film 17 is deposited over the upper surface of the semiconductor structure by the CVD method in a state in which the cavity opening at the surface of the Si layer 2 remains in the trench. Next, the insulating film portion formed at the outside of the trench is removed by CMP or etching.

Moreover, a cover layer is formed on the surface of the cavity such that the cavity is not exposed to the surface of the semiconductor structure. An oxide film 13 is formed as the cover layer over the region of the trench up to a position which is deeper than or equal to 1 $\mu$m from the surface of the silicon layer 2. Namely, the surface of the cavity is covered with the oxide film 13 such that the cavity exists downward from the position which is deeper than or equal to 1 $\mu$m from the surface of the silicon layer 2.

According to the power MISFET of FIG. 17, basically, the advantage which is the same as that of the power MISFET in FIG. 12 (the stress applied to the silicon substrate is suppressed, the process is simplified, and contaminants entering into the trench is prevented) and the advantage which is the same as that of the power MISFET in FIG. 13 (even if impurities exude from the BPSG film 17 by the heat treatment step after the step of burying the BPSG film 17 into the trench, the nitride film 14 prevents contaminants from entering) can be obtained.

<Power MISFET According to a Fifth Embodiment>

Figure 18:
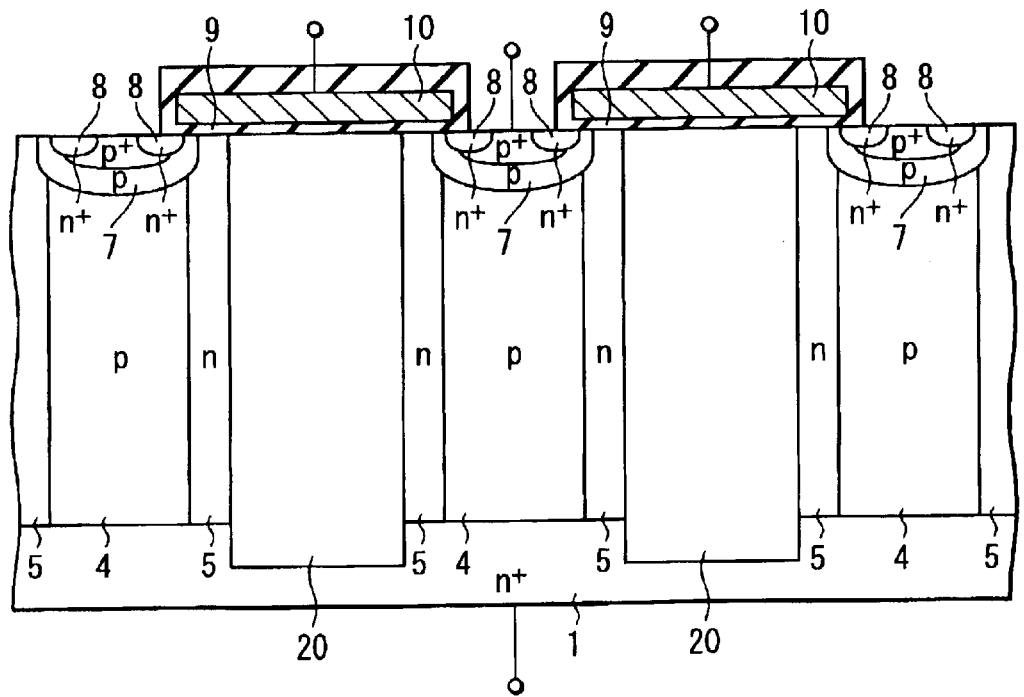
FIG. 18 is a cross sectional view showing a portion of a power MISFET according to a fifth embodiment of the present invention.

FIG. 18 is a cross sectional view showing a portion of a power MISFET according to a fifth embodiment of the present invention.

In the power MISFET of FIG. 18, since the structure of the trench isolation region is different from and other portions are the same as those of the power MISFETs of the first embodiment of FIG. 10, the second embodiment of FIG. 12, the third embodiment of FIG. 16 and the fourth embodiment of FIG. 17, portions which are the same as those in FIGS. 10, 12, 16 and 17 are denoted by the same reference numerals, and description thereof will be omitted.

The trench isolation region in FIG. 18 has the feature that the trench isolation region comprises silicon 20 formed in a state in which the interior of the trench is filled.

According to the power MISFET of FIG. 18, the interior of the trench is filled with the silicon (silicon layer) 20 which is the same material as the silicon substrate 11. Therefore, the thermal expansion coefficient of the silicon layer 20 is equal to the thermal expansion coefficients of the n-type pillar region 5 and the p-type pillar region 4 which are formed from silicon. Therefore, in the MISFET according to this embodiment, as compared with a case in which the entire interior of the trench is buried with the oxide film 13 and the nitride film 14 as in the power MISFET of FIG. 10, large thermal stress is not applied to the silicon substrate portion beneath the trench in the thermal process after deep isolation. Accordingly, the problems that crystal defects arise at the silicon substrate portion and the leak current increases, or the like can be prevented.

In order to stably ensure the reverse direction breakdown voltage between the drain and the source of the power MISFET, it is ideal that the impurity amounts of the N-type pillar region 5/the P-type pillar region 4/the N-type pillar region 5 are evenly balanced. However, when the impurities included in the silicon layer 20 in the aforementioned isolation region diffuse in the pillar regions, the balance of the impurity amounts of the pillar regions is destroyed, and there is the concern that deterioration of the breakdown voltage will be caused.

Here, by making the impurity amount included in the silicon layer 20 less than or equal to $1/10$ of the impurity amount of the pillar regions, destruction of the balance of the impurity amounts of the pillar regions can be suppressed so as to be less than or equal to ±10%, so that deterioration of the breakdown voltage can be suppressed.

<Power MISFET According to a Sixth Embodiment>

Figure 19:
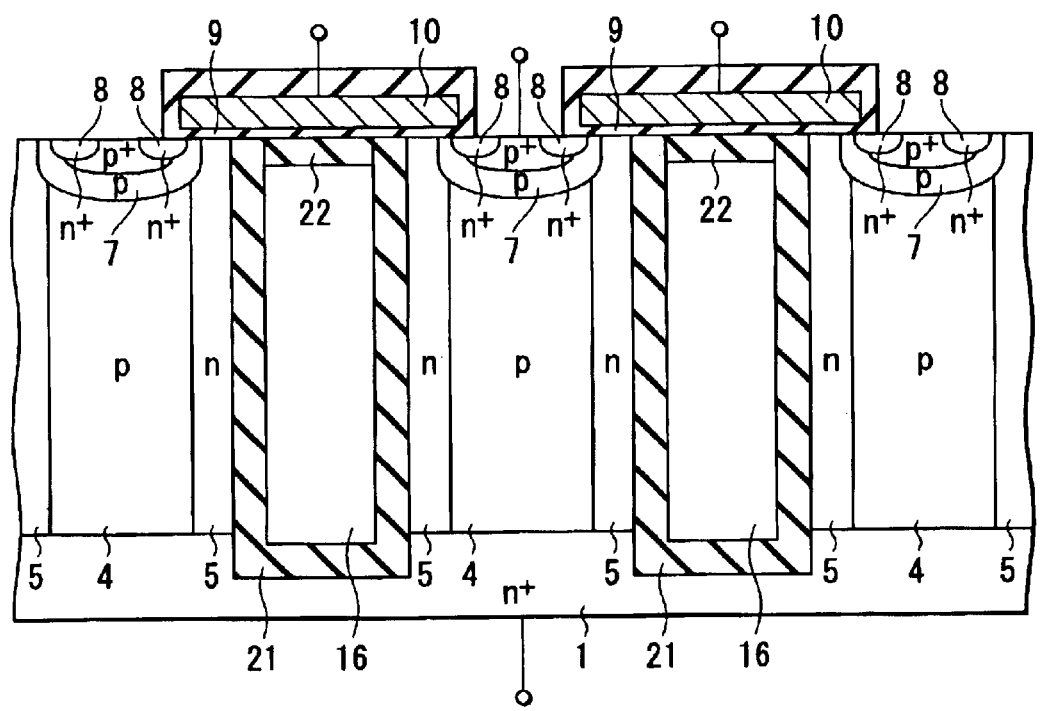
FIG. 19 is a cross sectional view showing a portion of a power MISFET according to a sixth embodiment of the present invention.

FIG. 19 is a cross sectional view showing a portion of a power MISFET according to a sixth embodiment of the present invention.

In the power MISFET of FIG. 19, since the structure of the trench isolation region is different from and other portions are the same as those of the power MISFETs of the first embodiment of FIG. 10, the second embodiment of FIG. 12, the third embodiment of FIG. 16, the fourth embodiment of FIG. 17, and a fifth embodiment of FIG. 18, portions which are the same as those in FIGS. 10, 12, 16, 17 and 18 are denoted by the same reference numerals, and description thereof will be omitted.

The trench isolation region in FIG. 19 has the feature that the trench isolation region comprises a silicon film 21 formed on the inner surfaces of the trench, and an oxide film 22 formed so as to cover the upper surface of the cavity provided in the trench. In this case, the oxide film 22 is formed over the region of the trench up to a position which is deeper than or equal to 1 µm from the surface of the Si layer 2.

According to the power MISFET of FIG. 19, even if the cavity exists in the trench, basically, advantages which are the same as those of the power MISFET in FIG. 18 can be obtained. Further, the oxide film 22 is formed over the region of the trench up to a position which is deeper than or equal to 1 µm from the surface of the silicon layer 2 so as to cover the upper surface of the cavity. Therefore, in the same way as the power MISFET of FIG. 12, the power MISFET of FIG. 15 can sufficiently withstand the heat treatment added later during the formation of the double diffusion-type MISFET.

In the fifth and sixth embodiments, in order to stably ensure the reverse direction breakdown voltage between the drain and the source of the power MISFET, it is ideal that the impurity amounts of the N-type pillar region 5/the P-type pillar region 4/the N-type pillar region 5 are evenly balanced. However, when the impurities included in the silicon film 21 in the aforementioned isolation region diffuse in the pillar regions, the balance of the impurity amounts of the pillar regions is destroyed, and there is the concern that deterioration of the breakdown voltage will be caused.

Here, by making the impurity amount included in the silicon layer 21 be less than or equal to $1/10$ of the impurity amount of the pillar regions, destruction of the balance of the impurity amounts of the pillar regions can be suppressed so as to be less than or equal to ±10%, so that deterioration of the breakdown voltage can be suppressed.

<Power MISFET According to a Seventh Embodiment>

Figure 20:
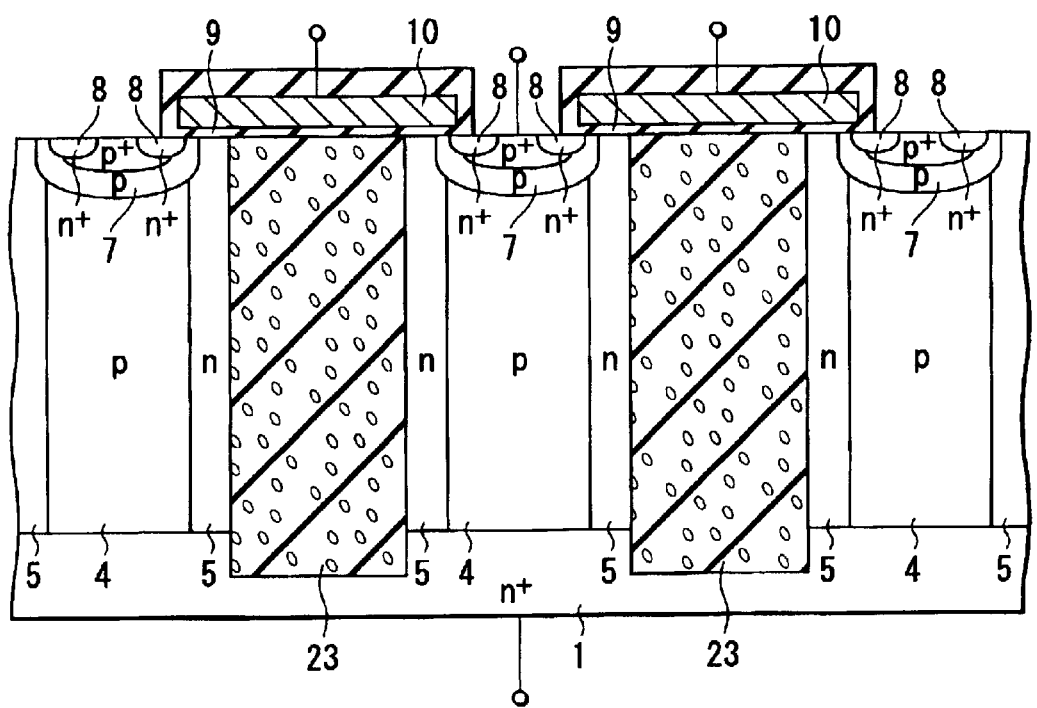
FIG. 20 is a cross sectional view showing a portion of a power MISFET according to a seventh embodiment of the present invention.

As shown in FIG. 20, a power MISFET according to a seventh embodiment differs in that the silicon layer 20 at the trench isolation region in the power MISFET of the fifth embodiment described with reference to FIG. 18, is changed to a porous silica 23 which is supplied from the exterior and buried into the interior of the trench, and the other portions are the same.

In accordance with such a power MISFET, since the interior of the trench is filled with the porous silica 23 and the porous silica 23 has a dielectric constant which is lower than that of the $SiO_2$ film, it is possible to realize low capacity between the gate and the drain of the MISFET, and an improvement in the operational speed of the MISFET can be achieved. Further, since the surface area of the porous silica 23 which contacts the inner surfaces of the trench is small, the stress applied to the silicon substrate can be suppressed.

Note that, by providing an oxide film series material layer 24 between particles of the porous silica, the particles can be made stable, and generation of dust caused from weak cohesion between particles can be suppressed.

<Power MISFET According to a Modified Example 1 of the Seventh Embodiment>

Figure 21:
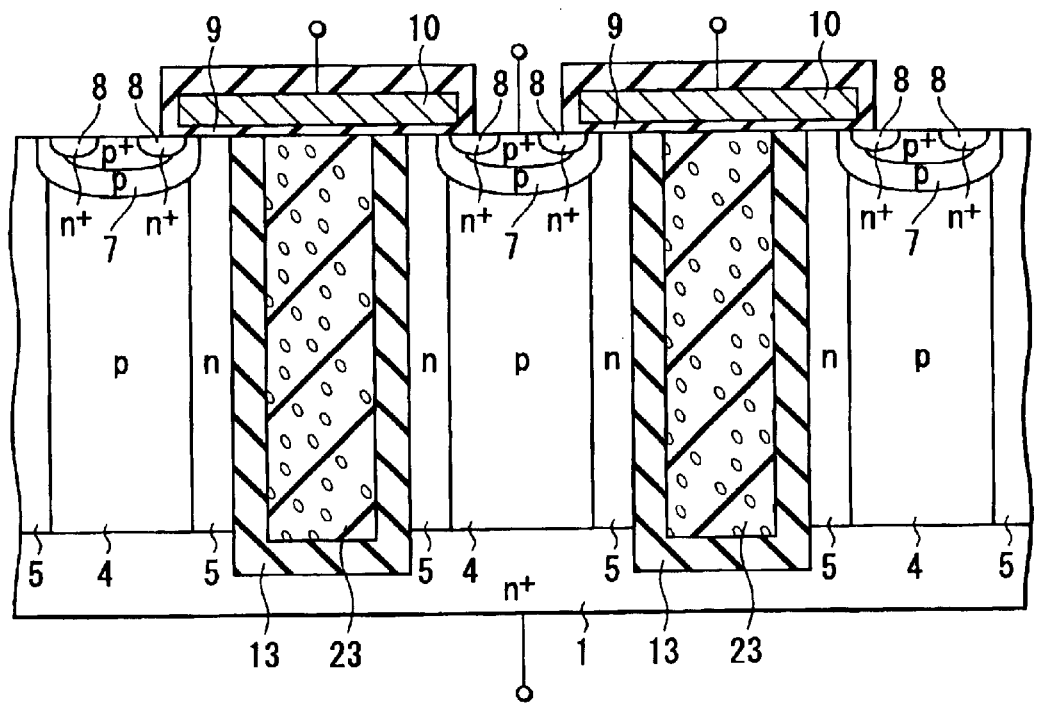
FIG. 21 is a cross sectional view showing a portion of a modified example of the power MISFET shown in FIG. 20 according to the seventh embodiment of the present invention.

As shown in FIG. 21, in the seventh embodiment, even when the porous silica 23 is buried via an oxide film 13 in the interior of the trench, the advantages according to the seventh embodiment can be obtained.

<Power MISFET According to a Modified Example 2 of the Seventh Embodiment>

In the seventh embodiment or the modified example 1 thereof, even when the aforementioned porous silica 23 is buried as an oxide melted by a heat treatment, the advantages according to the seventh embodiment can be obtained.

<Power MISFET According to Modified Example 3 of the Seventh Embodiment>

Figure 22:
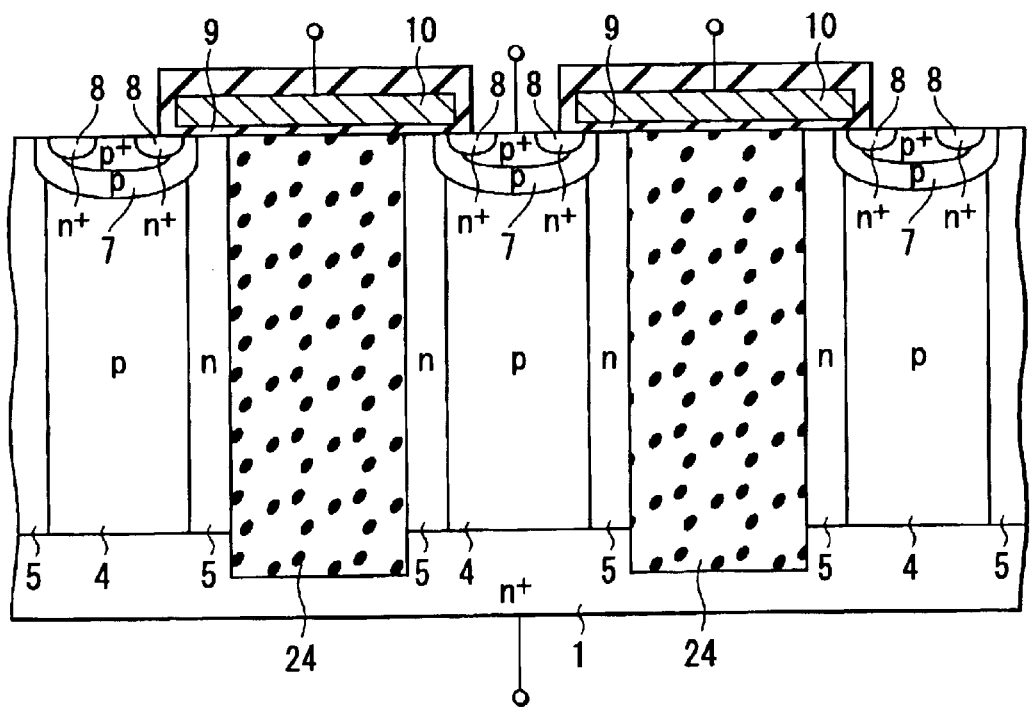
FIG. 22 is a cross sectional view showing a portion of another modified example of the power MISFET shown in FIG. 20 according to the seventh embodiment of the present invention.

As shown in FIG. 22, a power MISFET according to a modified example 3 of the seventh embodiment differs in that the silicon layer 20 at the trench isolation region in the power MISFET of the fifth embodiment described above with reference to FIG. 18, is changed to a particle composition oxide 24 made of oxide particles which is supplied from the exterior and buried in the interior of the trench, and the other portions are the same.

Here, the particle composition oxide 24 is one of, for example, silica ($SiO_2$), titania ($TiO_2$), zirconia ($ZrO_2$), alumina ($AlO_2$), and silicon carbide (SiC), which are used as an abrasive powder in a polishing step at the time of manufacturing a semiconductor device.

In accordance with such a power MISFET, the interior of the trench is filled with the particle composition oxide 24, and the filling is easier than a case in which the interior of the cavity is buried with other oxide films or silicon, and the filling step can be simplified.

Note that, by providing an oxide film series material between the particles of the particle composition oxide 24, the particles can be made stable, and generation of dust caused from weak cohesion between the particles can be suppressed.

<Power MISFET According to a Modified Example 4 of the Seventh Embodiment>

Figure 23:
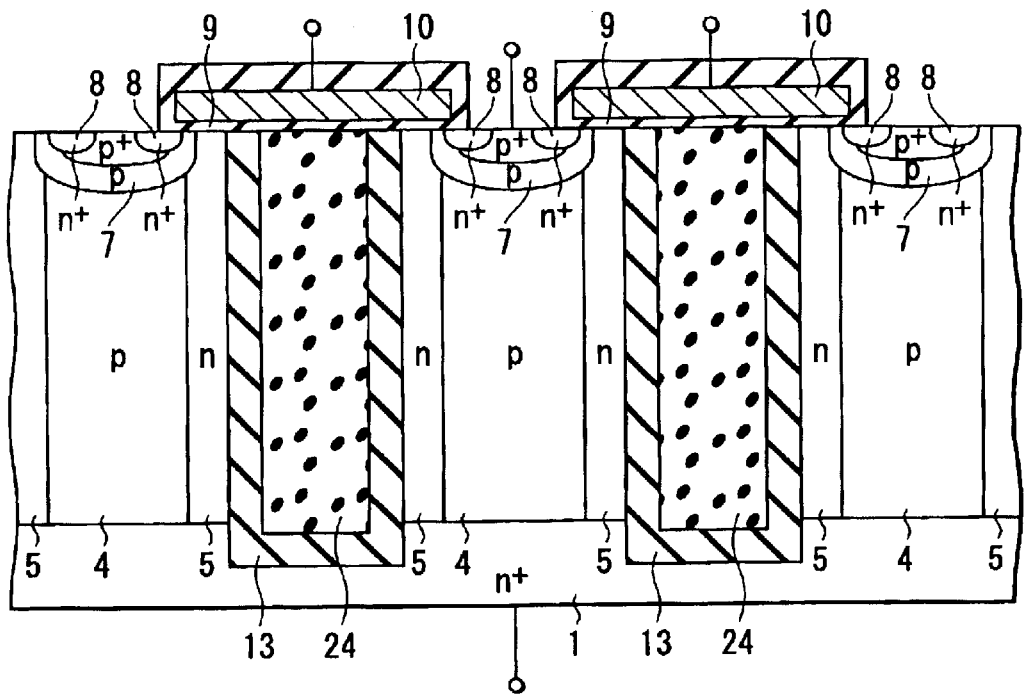
FIG. 23 is a cross sectional view showing a portion of a further modified example of the power MISFET shown in FIG. 20 according to the seventh embodiment of the present invention.

As shown in FIG. 23, in the modified example 3 of the seventh embodiment, even when the particle composition oxide 24 is buried via an oxide film 13 in the interior of the trench, the advantages according to the seventh embodiment can be obtained.

<Power MISFET According to an Eighth Embodiment>

Figure 24:
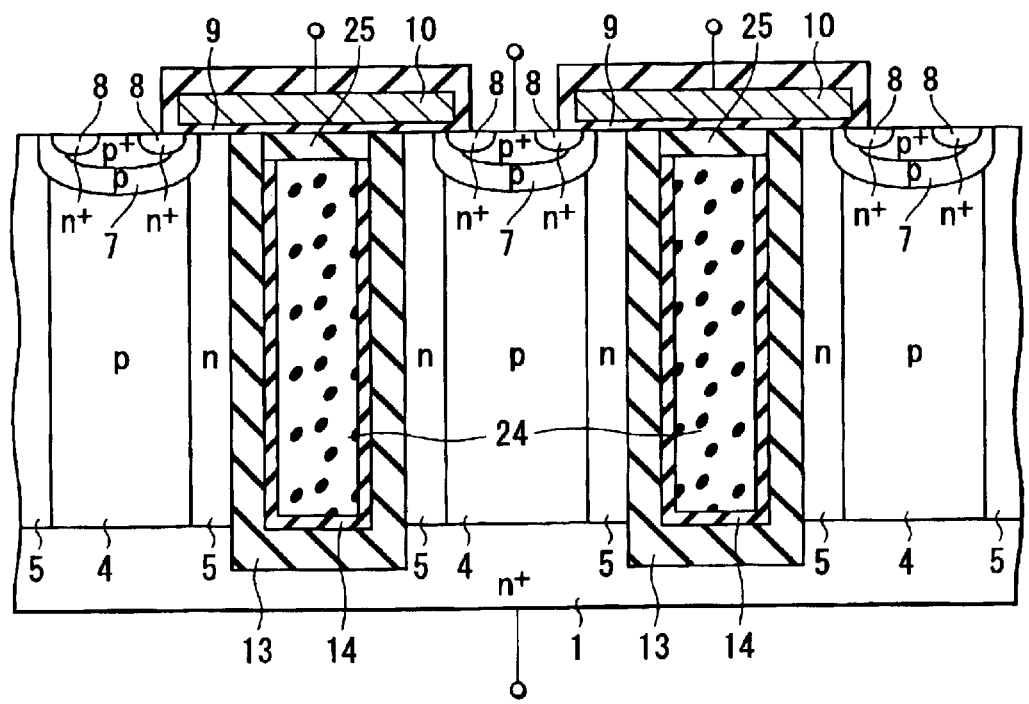
FIG. 24 is a cross sectional view showing a portion of a power MISFET according to an eighth embodiment of the present invention.

FIG. 24 is a cross sectional view showing a portion of a power MISFET according to an eighth embodiment of the present invention.

In the power MISFET of FIG. 24, since the structure of the trench isolation region is different from and other portions are the same as those of the power MISFETs of the first embodiment described with reference to FIG. 10, the second embodiment described with reference to FIG. 12, the third embodiment described with reference to FIG. 13, the fourth embodiment described with reference to FIG. 14, the fifth embodiment described with reference to FIG. 18, the sixth embodiment described with reference to FIG. 19, the seventh embodiment described with reference to FIG. 10, portions which are the same as those in FIGS. 10, 12, 16, 17, 18, 19 and 20 are denoted by the same reference numerals, and description thereof will be omitted.

The trench isolation region in FIG. 24 differs in that the trench isolation region comprises the first oxide film (thermal oxide film) 13 and the nitride film 14 formed on the inner surfaces (bottom surface and side surface) of the trench in a state in which a cavity is provided in the trench while maintaining the film thickness ratio of the oxide film 13 and the nitride film 14 to a predetermined value in the same way as in the first embodiment, and the particle-composition oxide 24 made of oxide particles which is supplied from the exterior and buried in the interior of the cavity, and a second oxide film (capping insulation film) 25 formed so as to cover the upper surface of the particle-composition oxide 24 and the nitride film 14.

Here, the particle-composition oxide 24 is one of silica ($SiO_2$), titania ($TiO_2$), zirconia ($ZrO_2$), alumina ($AlO_2$), and silicon carbide (SiC) as described above.

According to the power MISFET of FIG. 17, since the particle-composition oxide 24 made of oxide particles supplied from the exterior is buried in the cavity, as compared with a case in which the interior of the cavity is filled with oxide films of other compositions or silicon, the filling step can be simplified.

Note that, even if the oxide film 13 and the nitride film 14 exist in the trench before the particle composition oxide 24 is buried, if the film thickness ratio of the oxide film 13 and the nitride film 14 is, as described above, within a range in which the stress applied to the silicon substrate can be suppressed, good characteristics can be obtained.

<Power MISFET According to a Modified Example 1 of the Eighth Embodiment>

Figure 25:
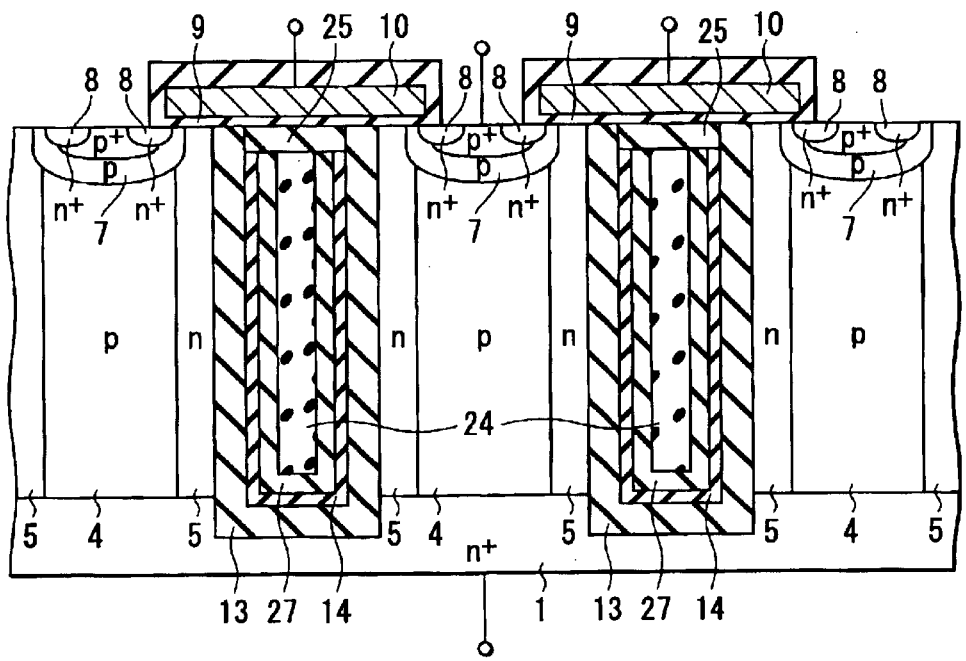
FIG. 25 is a cross sectional view showing a portion of a modified example of the power MISFET shown in FIG. 24 according to the eighth embodiment of the present invention.

As shown in FIG. 25, in the eighth embodiment, even when a BPSG film 27 is further formed on the nitride film 14 in a state in which a cavity is provided in the trench, and the particle composition oxide 24 is buried in the cavity, the advantages according to the eighth embodiment can be obtained.

<Power MISFET According to a Modified Example 2 of the Eighth Embodiment>

Figure 26:
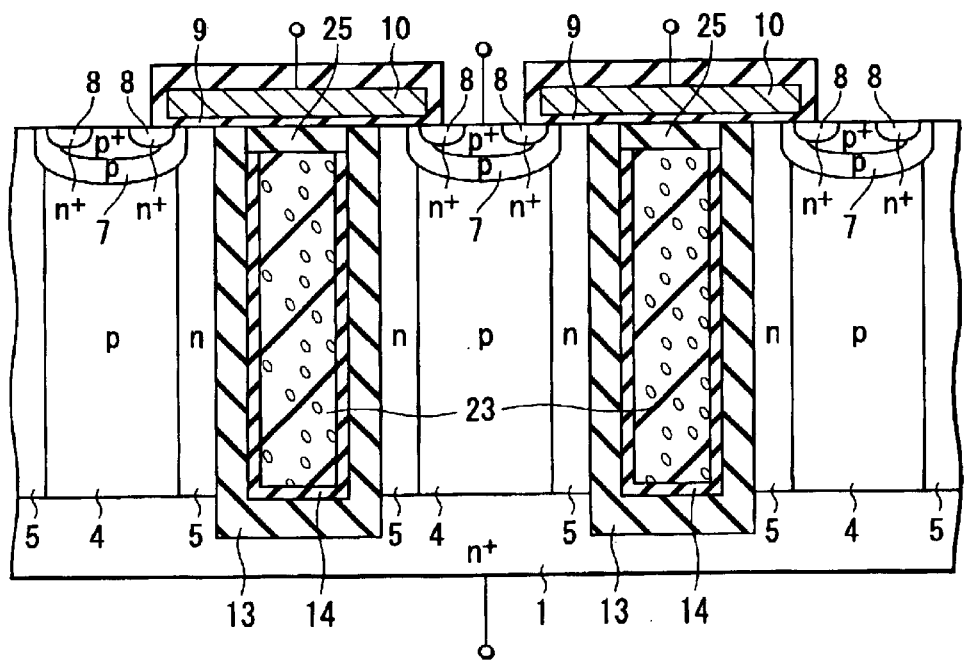
FIG. 26 is a cross sectional view showing a portion of another modified example of the power MISFET shown in FIG. 24 according to the eighth embodiment of the present invention.

As shown in FIG. 26, a power MISFET according to a modified example 2 of the eighth embodiment differs in that a porous silica 23 is used in place of the particle composition oxide 24 in the power MISFET of the eighth embodiment described above with reference to FIG. 24.

In accordance with such a power MISFET, since the porous silica 23 supplied from the exterior is buried in the cavity, and the porous silica 23 has a dielectric constant which is lower than the $SiO_2$ film, it is possible to lower the capacity of the MISFET. Further, as compared with a case in which the interior of the cavity is filled by deposition of a BPSG film as in the power MISFET of FIG. 13, the filling step can be simplified.

Note that, even if the oxide film 13 and the nitride film 14 exist in the trench before the porous silica 23 is buried, if the film thickness ratio of the oxide film 13 and the nitride film 14 is, as described above, within a range in which the stress applied to the silicon substrate can be suppressed, good characteristics can be obtained.

<Power MISFET According to Modified Example 3 of the Eighth Embodiment>

Figure 27:
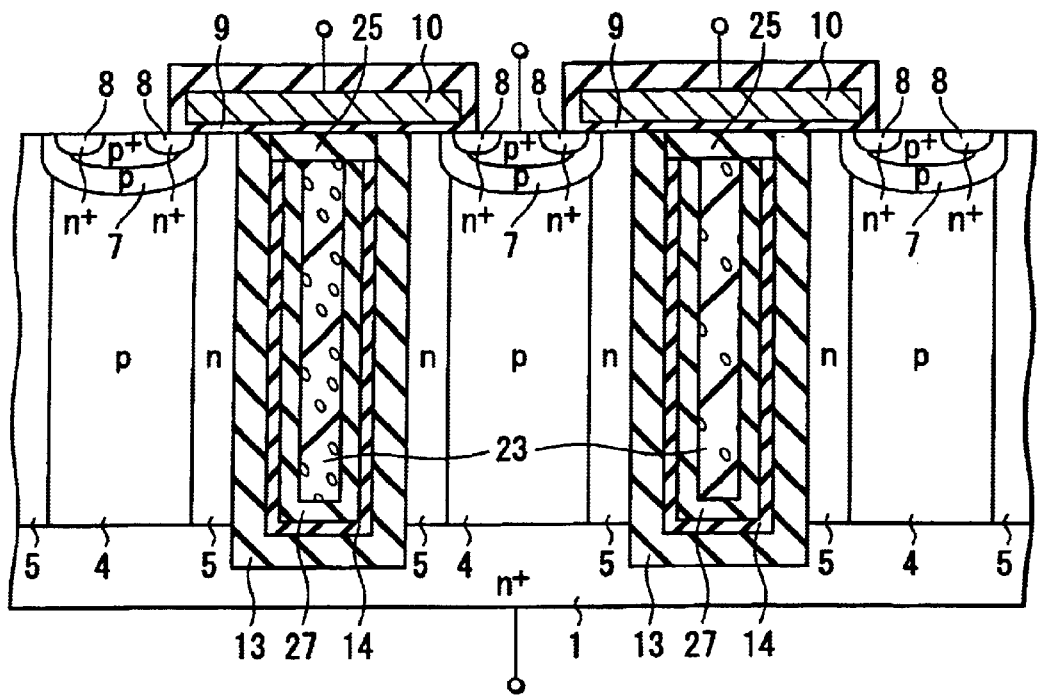
FIG. 27 is a cross sectional view showing a portion of a further modified example of the power MISFET shown in FIG. 24 according to the eighth embodiment of the present invention.
Figure 28:
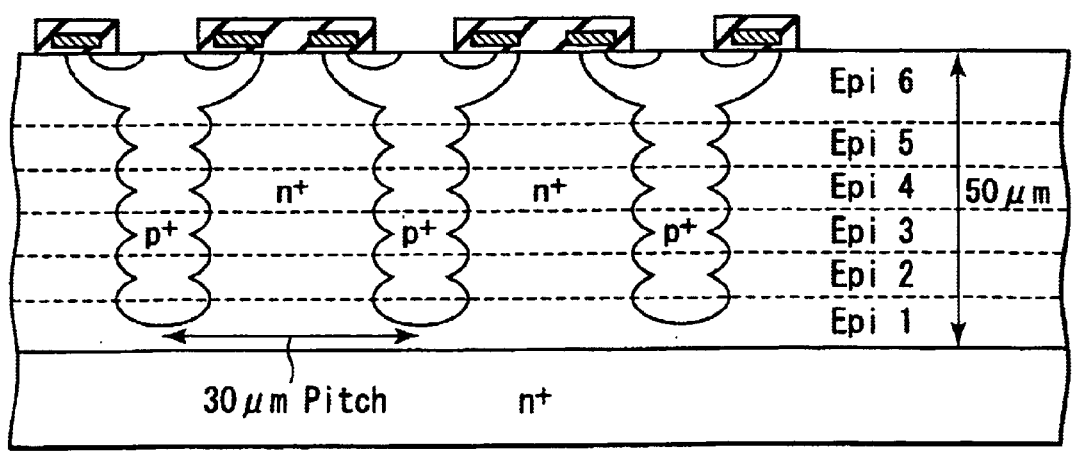
FIG. 28 is a cross sectional view schematically showing a portion of an element portion of a conventional power MISFET having a super junction structure.

As shown in FIG. 27, in the eighth embodiment, even when the BPSG film 27 is further formed on the nitride film 14 in a state in which a cavity is provided in the trench, and the porous silica 23 is buried in the cavity, the advantages according to the modified example 2 of the eighth embodiment can be obtained.

<Power MISFET According to Modified Example 4 of the Eighth Embodiment>

In the modified example 2 or the modified example 3 of the eighth embodiment, even when the porous silica 23 is buried as an oxide melted by a heat treatment, the advantages according to the modified example 2 or the modified example 3 of the eighth embodiment can be obtained.

In the embodiments in which a BPSG film 27 is provided at the inner side of the silicon oxide film 13 and the nitride film 14 in the isolation region among the embodiments, since the impurity diffusion in the nitride film 14 is extremely slow as compared with the impurity diffusion in the silicon oxide film 13, exuding of impurities from the BPSG film 27 is stopped in the nitride film 14.

For example, as compared with the boron concentration and the phosphorus concentration on the surface of the silicon substrate when the BPSG film 14 is deposited on the silicon substrate via the silicon oxide film and a thermal diffusion is carried out, when the BPSG film 14 is deposited on the silicon substrate via the silicon oxide film 13 and a nitride film 14 whose thickness is, for example, 20 nm and a thermal diffusion is carried out, the boron concentration on the surface of the silicon substrate is $2/100$, and the phosphorus concentration on the surface of the silicon substrate is $4/100$.

Accordingly, due to the aforementioned thickness of the nitride film being made to be greater than or equal to 20 nm, exuding of impurities from the BPSG film is prevented, and the balance of the impurity amounts at the pillar regions can be maintained, so that the reverse direction breakdown voltage across the drain and the source of the power MISFET can be stably ensured.

Note that the present invention is not limited to the above-described respective embodiments, for example, the channel type may be p-type rather than n-type. Moreover, a power MIS transistor and other circuits such as a control circuit or a protection network thereof may be formed in the same semiconductor chip.

According to the respective embodiments which were described above, it is possible to realize a semiconductor device in which both low ON-resistance and high breakdown voltage are achieved, and which can be manufactured without causing a large increase in the number of steps, and which has a trench isolation structure which can suppress stress applied to the substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type, which is a common drain of a plurality of MISFET cells;
   a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions;
   a base layer of the second conductivity type, which is formed in a surface of the second semiconductor pillar portion of each of the semiconductor pillar regions, the base layer having an impurity concentration which is higher than the second semiconductor pillar portions;
   a source diffusion layer of the first conductivity type, which is selectively formed in a surface of the base layer;
   a gate insulating film formed on a portion of the base layer, which is sandwiched by the source diffusion layer and each of the first semiconductor pillar portions;
   a gate electrode formed on the gate insulating film; and
   a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate,
   wherein each of the isolation regions comprises an oxide film formed on an inner surface of the trench and a nitride film formed on the oxide film, the nitride film being filled in the trench, and a film thickness ratio of the oxide film and the nitride film is in a range of 2:1 to 5:1.

2. A semiconductor device according to claim 1, wherein a semiconductor layer having the first conductivity type is formed in an upper surface of each of the first semiconductor pillar portions, the semiconductor layer having an impurity concentration which is higher than that of the first semiconductor pillar portions.

3. A semiconductor device comprising:
   a semiconductor substrate of a first conductivity type, which is a common drain of a plurality of MISFET cells;
   a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions;
   a base layer of the second conductivity type, which is formed in a surface of the second semiconductor pillar portion of each of the semiconductor pillar regions, the base layer having an impurity concentration which is higher than the second semiconductor pillar portion;
   a source diffusion layer of the first conductivity type, which is selectively formed in a surface of the base layer;
   a gate insulating film formed on a portion of the base layer, which is sandwiched by the source diffusion layer and each of the first semiconductor pillar portions;
   a gate electrode formed on the gate insulating film; and
   a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate,
   wherein each of the isolation regions comprises a first oxide film formed on an inner surface of the trench, a nitride film formed on the first oxide film, and a second oxide film formed to cover an upper surface of a cavity provided in the trench by the nitride film.

4. A semiconductor device according to claim 3, wherein a film thickness ratio of the first oxide film and the nitride film is in a range of 2:1 to 5:1.

5. A semiconductor device according to claim 3, wherein the cavity exists in the trench at a lower side portion which is lower than a depth lower by 1 μm or more from upper surfaces of the first semiconductor pillar portions.

6. A semiconductor device according to claim 3, wherein the cavity is in an atmosphere or in a vacuum.

7. A semiconductor device according to claim 3, wherein a semiconductor layer having the first conductivity type is formed in an upper surface of each of the first semiconductor pillar portions, the semiconductor layer having an impurity concentration which is higher than that of the first semiconductor pillar portions.

8. A semiconductor device comprising:
   a semiconductor substrate of a first conductivity type, which is a common drain of a plurality of MISFET cells;
   a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portion;
   a base layer of the second conductivity type, which is formed in a surface of the second semiconductor pillar portion of each of the semiconductor pillar regions, the base layer having an impurity concentration which is higher than the second semiconductor pillar portions;
   a source diffusion layer of the first conductivity type, which is selectively formed in a surface of the base layer;
   a gate insulating film formed on a portion of the base layer, which is sandwiched by the source diffusion layer and each of the first semiconductor pillar portions;
   a gate electrode formed on the gate insulating film; and
   a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate, wherein each of the isolation regions comprises a first oxide film formed on an inner surface of the trench, a nitride film formed on the first oxide film, and a second oxide film formed on the nitride film, the second oxide film being doped with boron and phosphorus and filled in the trench.

9. A semiconductor device according to claim 8, wherein a film thickness ratio of the first oxide film and the nitride film is in a range of 2:1 to 5:1.

10. A semiconductor device according to claim 8, wherein a semiconductor layer having the first conductivity type is formed in an upper surface of each of the first semiconductor pillar portions, the semiconductor layer having an impurity concentration which is higher than that of the first semiconductor pillar portions.

11. A semiconductor device comprising:
a semiconductor substrate of a first conductivity type, which is a common drain of a plurality of MISFET cells;
a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions;
a base layer of the second conductivity type, which is formed in a surface of the second semiconductor pillar portion of each of the semiconductor pillar regions, the base layer having an impurity concentration which is higher than the second semiconductor pillar portion;
a source diffusion layer of the first conductivity type, which is selectively formed in a surface of the base layer;
a gate insulating film formed on a portion of the base layer, which is sandwiched by the source diffusion layer and each of the first semiconductor pillar portions;
a gate electrode formed on the gate insulating film; and
a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate,
wherein each of the isolation regions comprises a first oxide film formed on an inner surface of the trench, a nitride film formed on the first oxide film, a second oxide film formed on the nitride film and doped with boron and phosphorus, a third oxide film formed to cover an upper surface of a cavity provided in the trench by the second oxide film.

12. A semiconductor device according to claim 11, wherein a film thickness ratio of the first oxide film and the nitride film is in a range of 2:1 to 5:1.

13. A semiconductor device according to claim 11, wherein the cavity exists in the trench at a lower side portion which is lower than a depth lower by 1 $\mu$m or more from upper surfaces of the first semiconductor pillar portions.

14. A semiconductor device according to claim 11, wherein the cavity is in an atmosphere or in a vacuum.

15. A semiconductor device according to claim 11, wherein the nitride film has a thickness of 20 nm or more.

16. A semiconductor device according to claim 11, wherein a semiconductor layer having the first conductivity type is formed in an upper surface of each of the first semiconductor pillar portions, the semiconductor layer having an impurity concentration which is higher than that of the first semiconductor pillar portions.

17. A semiconductor device comprising:
a semiconductor substrate of a first conductivity type, which is a common drain of a plurality of MISFET cells;
a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions;
a base layer of the second conductivity type, which is formed in a surface of the second semiconductor pillar portion of each of the semiconductor pillar regions, the base layer having an impurity concentration which is higher than the second semiconductor pillar portion;
a source diffusion layer of the first conductivity type, which is selectively formed in a surface of the base layer;
a gate insulating film formed on a portion of the base layer, which is sandwiched by the source diffusion layer and each of the first semiconductor pillar portions;
a gate electrode formed on the gate insulating film; and
a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate,
wherein each of the isolation regions comprises a silicon film formed in the trench.

18. A semiconductor device according to claim 17, the silicon film has an impurity concentration lower than 1/10 of that of the semiconductor pillar regions.

19. A semiconductor device according to claim 17, wherein the silicon film is formed of a silicon film filled in the trench.

20. A semiconductor device according to claim 17, wherein the silicon film is formed on an inner surface of the trench, and each of the isolation regions further comprises an oxide film formed to cover an upper surface of a cavity provided in the trench by the silicon film.

21. A semiconductor device according to claim 17, wherein the cavity exists in the trench at a lower side portion which is lower than a depth lower by 1 $\mu$m or more from upper surfaces of the first semiconductor pillar portions.

22. A semiconductor device according to claim 17, wherein the cavity is in an atmosphere or in a vacuum.

23. A semiconductor device according to claim 17, wherein a semiconductor layer having the first conductivity type is formed in an upper surface of each of the first semiconductor pillar portions, the semiconductor layer having an impurity concentration which is higher than that of the first semiconductor pillar portions.

24. A semiconductor device comprising:
a semiconductor substrate of a first conductivity type, which is a common drain of a plurality of MISFET cells;
a plurality of semiconductor pillar regions each having first and second semiconductor pillar portions formed on a surface of the semiconductor substrate, the first and second semiconductor pillar portions having a vertically strip-shaped cross-section, the first semiconductor pillar portions having the first conductivity type, the second semiconductor pillar portion having a second conductivity type, the second semiconductor pillar portion being sandwiched by the first semiconductor pillar portions;
a base layer of the second conductivity type, which is formed in a surface of the second semiconductor pillar portion of each of the semiconductor pillar regions, the base layer having an impurity concentration which is higher than the second semiconductor pillar portion;
a source diffusion layer of the first conductivity type, which is selectively formed in a surface of the base layer;
a gate insulating film formed on a portion of the base layer, which is sandwiched by the source diffusion layer and each of the first semiconductor pillar portions;
a gate electrode formed on the gate insulating film; and
a plurality of isolation regions which isolates the semiconductor pillar regions from each other, the isolation regions being formed in trenches between the semiconductor pillar regions, the trenches being formed on the surface of the semiconductor substrate and reaching the surface of the semiconductor substrate,
wherein each of the isolation regions comprises a porous silica film filled in the trench.

25. A semiconductor device according to claim 24, wherein an oxide-base material is provided among particles of the porous silica film.

26. A semiconductor device according to claim 24, wherein each of the isolation regions further comprises an oxide film formed on an inner surface of the trench, and the porous silica film is filled in the trench covered by the oxide film.

27. A semiconductor device according to claim 24, wherein each of the isolation regions further comprises an oxide film formed on an inner surface of the trench and a nitride film formed on the oxide film, the porous silica film is filled in the trench covered by the nitride film, and each of the isolation regions further comprises an insulation film formed to cover upper surfaces of the porous silica film and the nitride film.

28. A semiconductor device according to claim 27, wherein a film thickness ratio of the first oxide film and the nitride film is in a range of 2:1 to 5:1.

29. A semiconductor device according to claim 24, wherein a semiconductor layer having the first conductivity type is formed in an upper surface of each of the first semiconductor pillar portions, the semiconductor layer having an impurity concentration which is higher than that of the first semiconductor pillar portions.

30. A semiconductor device comprising:
a semiconductor substrate of a first conductivity type, which is a common drain of a plurality of MISFET cells;
a plurality of semiconductor pillar regions each having first and second semiconductor pillar portions formed on a surface of the semiconductor substrate, the first and second semiconductor pillar portions having a vertically strip-shaped cross-section, the first semiconductor pillar portion having the first conductivity type, the second semiconductor pillar portion having a second conductivity type, the second semiconductor pillar portion being sandwiched by the first semiconductor pillar portions;
a base layer of the second conductivity type, which is formed in a surface of the second semiconductor pillar portion of each of the semiconductor pillar regions, the base layer having an impurity concentration which is higher than the second semiconductor pillar portions;
a source diffusion layer of the first conductivity type, which is selectively formed in a surface of the base layer;
a gate insulating film formed on a portion of the base layer, which is sandwiched by the source diffusion layer and the first semiconductor pillar portion;
a gate electrode formed on the gate insulating film; and
a plurality of isolation regions which isolates the semiconductor pillar regions from each other, the isolation regions being formed in trenches provided between the semiconductor pillar regions, the trenches being formed on the surface of the semiconductor substrate and reaching the surface of the semiconductor substrate,
wherein each of the isolation regions comprises an particle composition oxide film made of oxide particles filled in the trench.

31. A semiconductor device according to claim 30, wherein the particle composition oxide film is one selected from a group including silica ($SiO_2$), titania ($TiO_2$), zirconia ($ZrO_2$), alumina ($AlO_2$), and silicon carbide (SiC).

32. A semiconductor device according to claim 30, wherein an oxide-base material is provided between the particles of the particle composition oxide film.

33. A semiconductor device according to claim 30, wherein each of the isolation regions further comprises an oxide film formed on an inner surface of the trench, and the particle composition oxide film is filled in the trench covered by the oxide film formed on the inner surface of the trench.

34. A semiconductor device according to claim 30, wherein each of the isolation regions further comprises an oxide film formed on an inner surface of the trench and a nitride film formed on the oxide film, the particle composition oxide film is filled in the trench covered by the nitride film, and each of the isolation regions further comprises an insulation film formed to cover the upper surfaces of the particle composition oxide film and the nitride film.

35. A semiconductor device according to claim 34, wherein a film thickness ratio of the oxide film formed on the inner surface of the trench and the nitride film is in a range of 2:1 to 5:1.

36. A semiconductor device according to claim 30, wherein each of the isolation regions further comprises an oxide film formed on an inner surface of the trench, a nitride film formed on the oxide film, and a BPSG film formed on the nitride film, and the porous silica film is filled in the trench covered by the BPSG film.

37. A semiconductor device according to claim 36, wherein a film thickness ratio of the oxide film formed on the inner surface of the trench and the nitride film is in a range of 2:1 to 5:1.

38. A semiconductor device according to claim 36, wherein the nitride film has a thickness of 20 nm or more.

39. A semiconductor device according to claim 36, wherein a film thickness ratio of the oxide film formed on the inner surface of the trench and the nitride film is in a range of 2:1 to 5:1, and the nitride film has a thickness of 20 nm or more.

40. A semiconductor device according to claim 30, wherein each of the isolation regions further comprises an oxide film formed on an inner surface of the trench, a nitride film formed on the oxide film, and a BPSG film formed on the nitride film, and the particle composition oxide film is filled in the trench covered by the BPSG film.

41. A semiconductor device according to claim 40, wherein a film thickness ratio of the oxide film formed on the inner surface of the trench and the nitride film is in a range of 2:1 to 5:1.

42. A semiconductor device according to claim 40, wherein the nitride film has a thickness of 20 nm or more.

43. A semiconductor device according to claim 40, wherein a film thickness ratio of the oxide film formed on the inner surface of the trench and the nitride film is in a range of 2:1 to 5:1, and the nitride film has a thickness of 20 nm or more.

44. A semiconductor device according to claim 30, wherein a semiconductor layer having the first conductivity type is formed in an upper surface of each of the first semiconductor pillar portions, the semiconductor layer having an impurity concentration which is higher than that of the first semiconductor pillar portions.

* * * * *